United States Patent
Nagarajan et al.

(10) Patent No.: US 9,323,128 B1
(45) Date of Patent: Apr. 26, 2016

(54) OFF QUADRATURE BIASING OF MACH ZEHNDER MODULATOR FOR IMPROVED OSNR PERFORMANCE

(71) Applicant: Inphi Corporation, Santa Clara, CA (US)

(72) Inventors: Radhakrishnan L. Nagarajan, Cupertino, CA (US); Hari Shankar, Westlake Village, CA (US); Masaki Kato, Palo Alto, CA (US); Yang Fu, San Jose, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/706,908

(22) Filed: May 7, 2015

(51) Int. Cl.
*G02F 1/01* (2006.01)
*G02B 6/12* (2006.01)
*G02F 1/225* (2006.01)
*H01S 3/067* (2006.01)
*G02F 1/21* (2006.01)
*H04B 10/50* (2013.01)
*G02F 1/025* (2006.01)

(52) U.S. Cl.
CPC .......... *G02F 1/225* (2013.01); *G02B 6/12004* (2013.01); *G02F 1/0123* (2013.01); *H01S 3/06716* (2013.01); *H01S 3/06754* (2013.01); *G02B 6/12007* (2013.01); *G02B 2006/12142* (2013.01); *G02F 1/0147* (2013.01); *G02F 1/025* (2013.01); *G02F 2001/212* (2013.01); *H04B 10/505* (2013.01)

(58) Field of Classification Search
CPC ....... G02F 1/025; G02F 1/0147; G02F 1/225; G02F 1/0123; G02B 6/12004; G02B 6/12007; H04B 10/505; H01S 3/06716; H01S 3/06754
USPC .......................................... 385/1, 14
See application file for complete search history.

(56) References Cited

U.S. PATENT DOCUMENTS

| 7,751,658 B2 * | 7/2010 | Welch ..................... H01S 5/026 385/14 |
| 2003/0175037 A1 * | 9/2003 | Kimmitt ............... G02F 1/0123 398/198 |

\* cited by examiner

*Primary Examiner* — Jerry Blevins
(74) *Attorney, Agent, or Firm* — Richard T. Ogawa; Ogawa P.C.

(57) ABSTRACT

An integrated optical modulator device. The device can include a driver module coupled to an optical modulator. The optical modulator is characterized by a raised cosine transfer function. This optical modulator can be coupled to a light source and a bias control module, which is configured to apply an off-quadrature bias to the optical modulator. This bias can be accomplished by applying an inverse of the modulator transfer function to the optical modulator in order to minimize a noise variance. This compression function can result in an optimized increased top eye opening for a signal associated with the optical modulator. Furthermore, the optical modulator can be coupled to an EDFA (Erbium Doped Fiber Amplifier) that is coupled to a filter coupled an O/E (Optical-to-Electrical) receiver.

20 Claims, 23 Drawing Sheets

OFF QUADRATURE BIASING OF MACH ZEHNDER MODULATOR FOR IMPROVED OSNR PERFORMANCE

CROSS-REFERENCE TO RELATED APPLICATIONS

N/A

BACKGROUND OF THE INVENTION

The present invention relates to telecommunication techniques and integrated circuit (IC) devices. More specifically, various embodiments of the present invention provide an integrated optical modulator device.

Over the last few decades, the use of communication networks has exploded. In the early days of the Internet, popular applications were limited to emails, bulletin board, and mostly informational and text-based web page surfing, and the amount of data transferred was relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication systems implementing Optical Fiber Links. As CMOS technology is scaled down to make circuits and systems run at higher speed and occupy smaller chip (die) area, the operating supply voltage is reduced for lower power consumption. Conventional FET transistors in deep-submicron CMOS processes have very low breakdown voltage as a result the operating supply voltage is maintained around 1 Volt. The Photo-detectors (PD) used in 28G and 10G Optical Receivers require a bias voltage of more than 2 Volts across the anode and cathode nodes of the PD for better photo-current responsivity. These limitations provide significant challenges to the continued improvement of communication systems scaling and performance.

There have been many types of communication systems and methods. Unfortunately, they have been inadequate for various applications. Therefore, improved communication systems and methods are desired.

BRIEF SUMMARY OF THE INVENTION

The present invention relates to telecommunication techniques and integrated circuit (IC) devices. More specifically, various embodiments of the present invention provide an off-quadrature biased integrated optical modulator device.

In optically amplified systems, the dominant noise source is the optical amplifier, which is typically an EDFA (Erbium Doped Fiber Amplifier) in DWDM (Dense Wavelength Division Multiplexing) systems. The major component of the amplifier noise in such systems is the signal-spontaneous beat noise, which is due to the interference between the amplified signal and ASE (Amplified Spontaneous Emission). Considering that the noise power is relatively small in beat noise, this noise will dominate when the signal power is at its highest. Conversely, if there is no signal, there is no beat noise.

In an example, the highest noise and largest eye closure happens at the top level for a 4-level PAM (Pulse-Amplitude Modulation) signal or the "1" level in the NRZ modulation format. More specifically, if the different levels of the PAM-4 (4-level PAM) signal are set up in an equally spaced configuration, the noise impacts the top level most, and leads to the greatest eye closure. However, if the individual levels can be reshaped such that the largest opening is at the top level, then the noise contribution between the various levels can be equalized to improve system performance. This technique can be applied to 4-level PAM systems, 8-level PAM systems, 16-level PAM systems, and the like.

The present invention provides several embodiments of an electro-optical modulator with improved OSNR (Optical Signal-to-Noise Ratio) by the application of an off-quadrature bias. This application is counter intuitive, as typical applications of an optical modulator, such as an MZM (Mach-Zehnder Modulator) or the like, are biased at quadrature (50% point in a DC characteristic plot) to produce the maximum signal swing. However, by biasing the optical modulator off-quadrature and sacrificing a portion of the signal swing, the optical modulator exhibits a much improved OSNR in an optically amplified system.

In an embodiment, the present invention provides an optical modulator device. This device can include a driver module coupled to an optical modulator. The optical transfer function of a Mach Zehnder interferometer optical modulator is characterized by a raised cosine or sine transfer function. This optical modulator can be coupled to a light source and a bias control module, which is configured to apply an off-quadrature bias to the optical modulator. This bias can be accomplished by applying a DC bias function to the optical modulator in order to minimize a noise variance that is proportional to $2\sqrt{n\Delta P_{ASE}}$, wherein $n\Delta$ is signal level n and $P_{ASE}$ is Amplified Spontaneous Emission Power. This compression function can result in an optimized increased top eye opening for a signal associated with the optical modulator. Furthermore, the optical modulator can be coupled to an EDFA (Erbium Doped Fiber Amplifier) that is coupled to a filter coupled an O/E (Optical-to-Electrical) receiver. Those of ordinary skill in the art will recognize other variations, modifications, and alternatives.

Many benefits are recognized through various embodiments of the present invention. Such benefits include improved system performance due to off-quadrature biasing of an optical modulator device. Embodiments of this off-quadrature bias configuration provide improvements to OSNR (Optical Signal-to-Noise Ratio) of an optical system. Other benefits will be recognized by those of ordinary skill in the art that the mechanisms described can be applied to other optical systems as well.

The present invention achieves these benefits and others in the context of known data transmission and optically amplified technologies. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

Figure 1:
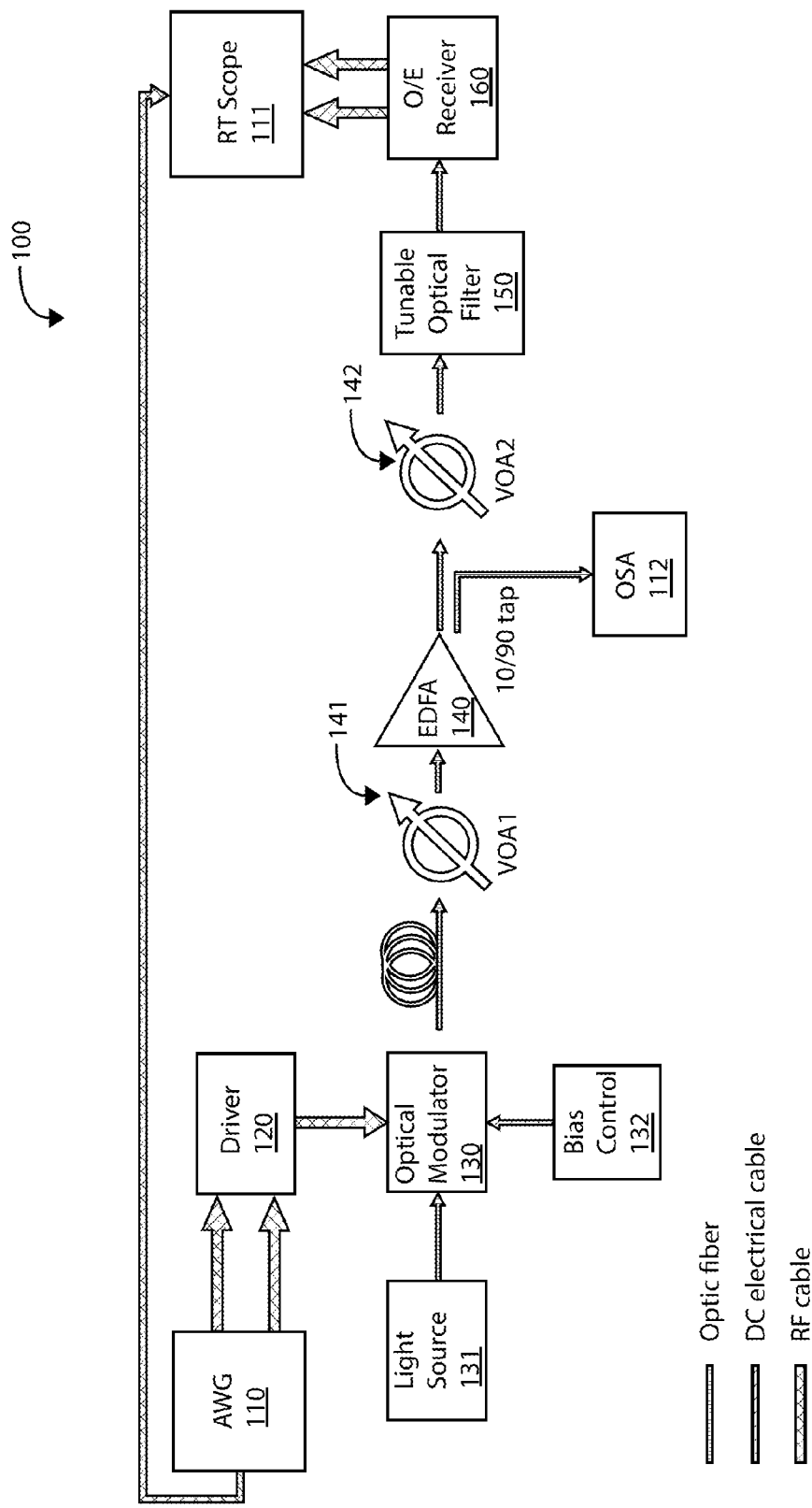
FIG. 1 is a simplified block diagram of an integrated optical modulator device according to an embodiment of the present invention.

You need to include this in the figure to explain what off-quadrature bias means. And also why you have to bias the modulator towards the null point and not the maximum transmission point for this technique to work.

DETAILED DESCRIPTION OF THE INVENTION

The present invention relates to telecommunication techniques and integrated circuit (IC) devices. More specifically, various embodiments of the present invention provide an off-quadrature biased integrated optical modulator device. With the off-quadrature bias, the behavior of the optical modulator can be modified in order to minimize noise and improve system performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In optically amplified systems, the dominant noise source is the optical amplifier, which is typically an EDFA (Erbium Doped Fiber Amplifier) in DWDM (Dense Wavelength Division Multiplexing) systems. The major component of the amplifier noise in such systems is the signal-spontaneous beat noise, which is due to the interference between the amplified signal and ASE (Amplified Spontaneous Emission). Considering that the noise power is relatively small in beat noise, this noise will dominate when the signal power is at its highest (e.g. highest light intensity). Conversely, if there is no signal, there is no beat noise.

In an example, the highest noise and largest eye closure happens at the top level for a 4-level PAM (Pulse-Amplitude Modulation) signal. More specifically, if the different levels of the PAM-4 (4-level PAM) signal are set up in an equally spaced configuration, the noise impacts the top level and leads to the greatest eye closure. However, if the individual levels can be reshaped such that the largest opening is at the top level, then the noise contribution between the various levels can be equalized to improve system performance. This technique can be applied to 4-level PAM systems, 8-level PAM systems, 16-level PAM systems, and the like.

In one or more embodiments, the present invention provides an electro-optical modulator with improved OSNR (Optical Signal-to-Noise Ratio) by the application of an off-quadrature bias. This application is counter intuitive, as typical applications of an optical modulator, such as an MZM (Mach-Zehnder Modulator) or the like, are biased at quadrature (50% point in a DC characteristic plot) to produce the maximum signal swing. However, by biasing the optical modulator off-quadrature and sacrificing a portion of the signal swing, the optical modulator exhibits a much improved OSNR. The following discussion of the figures will give examples of optical modulator devices and its method of operation.

FIG. 1 is a simplified block diagram of an integrated optical modulator device according to an embodiment of the present invention. As shown, optical modulator device 100 is configured in a test configuration coupled to a signal generator 110 and an oscilloscope 111. The signal generator 110 can be configured to provide, by an RF cable, the oscilloscope 111 a 10 MHz reference signal, or other reference signal depending upon application. The signal generator 110 can be an AWG (Arbitrary Waveform Generator) 110, such as a 72 Gb/s AWG, or the like. The oscilloscope 111 can be an RT (Real-Time) scope, such as a 63 GHz RT Scope, or the like. This test configuration allows for testing of the optical modulator device by controlling inputs and recording outputs.

In an embodiment, the optical modulator device 100 can include a driver 120 coupled to an optical modulator 130. The driver 120 can be a differential input, single-ended output, variable gain, linear driver, which can receive a differential input from the AWG 110 by RF cables and transmit the signal output to the optical modulator 130. A light source 131 and a bias control module 132 can both be coupled to the optical modulator 130. In an example, the optical modulator 130 can be an MZM, or the like, and the light source 131 can be a laser module, an ITLA (Integrable Tunable Laser Assembly), or the like.

In a specific embodiment, the optical modulator driver 120, the light source 131, and the bias control module 132 all feed inputs via interconnections to the optical modulator 130. The interconnection between the driver 120 and the optical modulator 130 can be an RF (Radio Frequency) cable and the interconnection between the bias control module 132 and the signal relay module 130 can be a DC (Direct Current) electrical cable. Also, the interconnection between the light source 131 and the optical modulator 130 can be an optical fiber cable.

In an embodiment, the optical modulator 130 can be coupled to an EDFA (Erbium-doped Fiber Amplifier) 140, which can be coupled to a tunable optical filter 150. The optical filter 150 can be coupled to an O/E (Optical-to-Electrical) receiver 160. The O/E receiver 160 can be coupled to the oscilloscope 111. The interconnections from the O/E receiver 160 can be RF cables providing a differential output to the scope 111. Also, an OSA (Optical Spectrum Analyzer) 112 can be coupled to the EDFA 140 to measure the EDFA parameters. The OSA 112 can be configured to the EDFA 140 by a 10/90 tap coupler, which directs 10% to the output and 90% to the gain medium.

In a specific embodiment, the signal relay module 130 can be coupled to a first VOA (Variable Optical Attenuator) 141 to the EDFA 140 and then to a second VOA 142, which is coupled to the tunable optical filter 150. The interconnections between these modules can be optical fibers characterized by 0, 10, or 20 km SMF (Single-Mode Fiber). Those of ordinary skill in the art will recognize other variations, modifications, and alternatives.

As described previously, as aspect of the present invention is to bias the optical modulator off-quadrature in order to obtain a much improved or optimal OSNR. The optical modulator 130 is characterized by a raised cosine or sine transfer function, which can be represented by the equation:

$$\frac{1}{2}\left[1 + \sin\left[\frac{v}{v_{pi}}\pi\right]\right],$$

where v is the voltage input and $v_{pi}$ is the voltage needed to reach phase pi. This is to say that the DC transfer function of the modulator exhibits the behavior of a sinusoidal curve having phase characteristic of a cosine function with an average value or approximately 0.5.

In order to achieve the expansion of the top level in the PAM-4 signal example, a DC bias function can be applied via the bias control module 132 to the optical modulator. A method of expanding the top level of the PAM-4 signal is to apply a DC bias compression function to compress the lower levels of the PAM-4 signal. In a specific embodiment, this compression function is characterized by an inverse raised sine function, an inverse of the transfer function, or the like. In the DC transfer curve, this compression function squeezes the bottom half of the sinusoid curve, which can result in a more flattened trough.

Figure 2B:
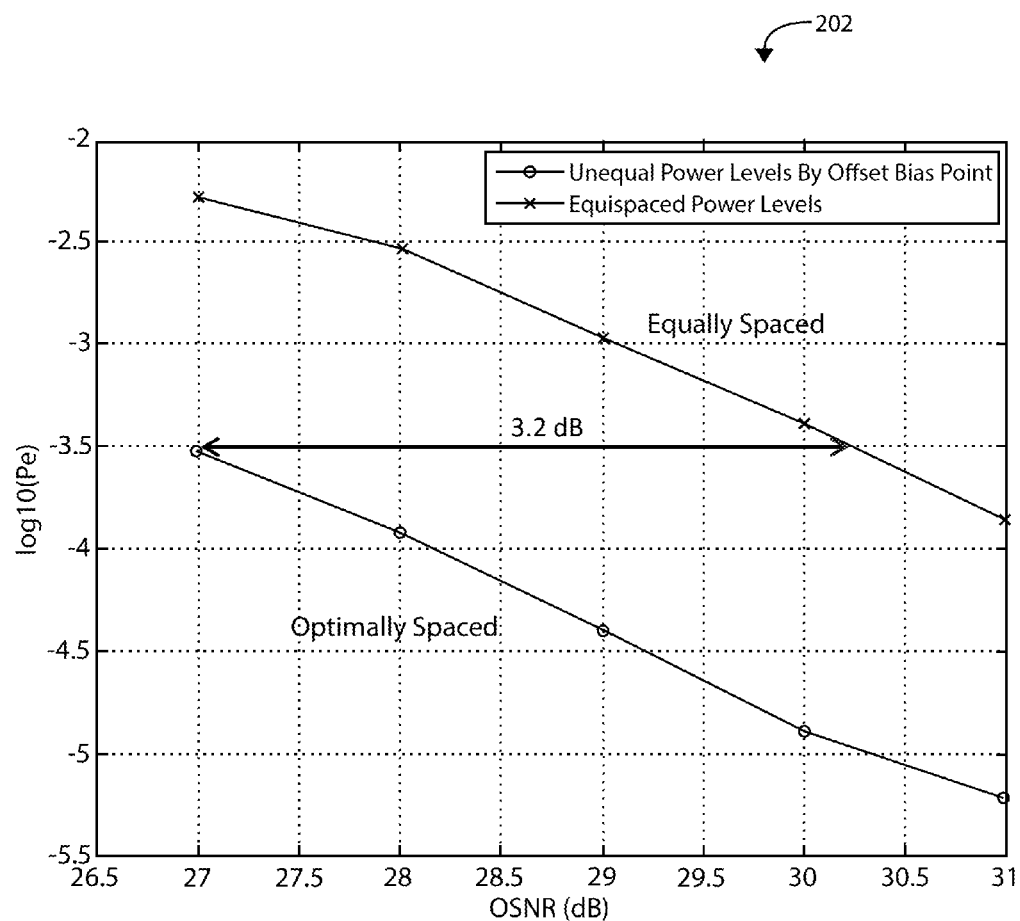
FIG. 2B is a simplified graph showing the OSNR (Optical Signal-to-Noise Ratio) for an off-quadrature biased optical modulator device and a quadrature biased optical modulator device according to an embodiment of the present invention.
Figure 3:
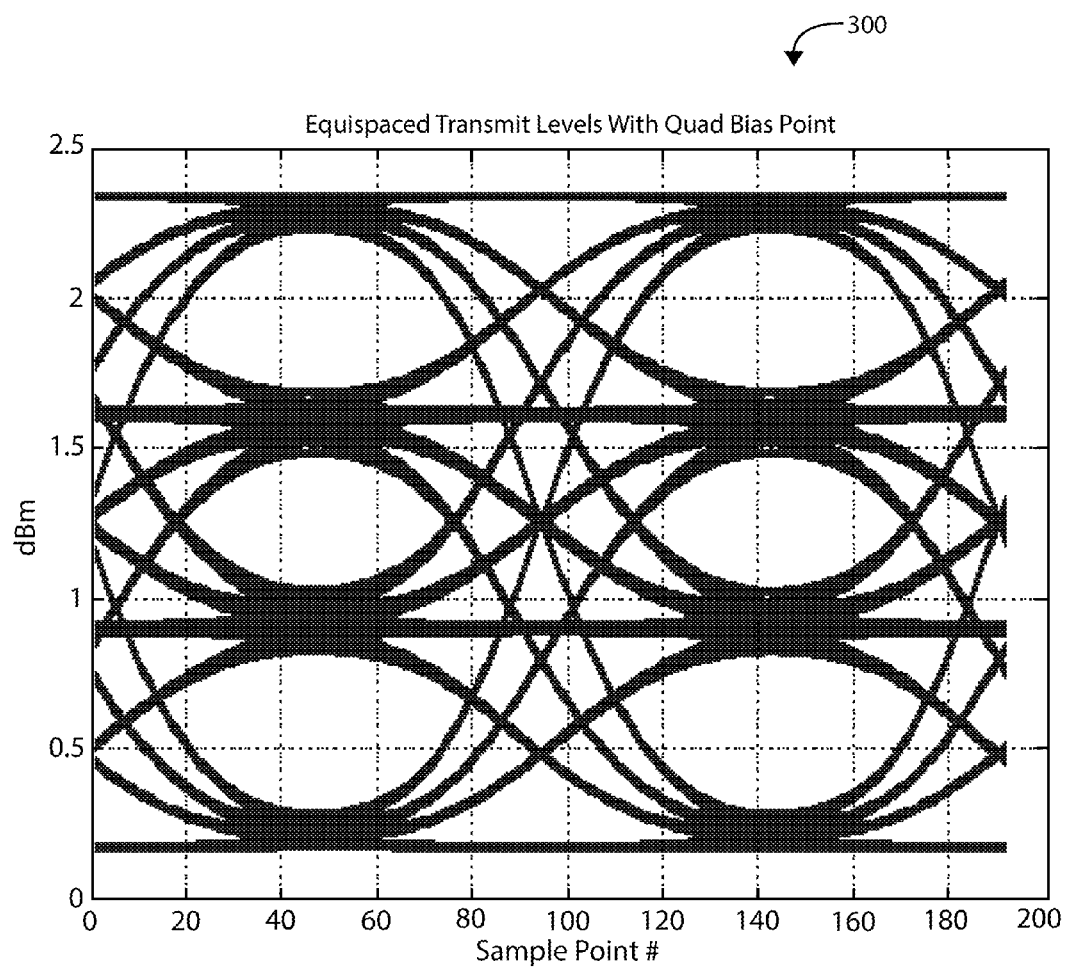
FIG. 3 is a simplified graph representing a signal output for a quadrature biased optical modulator device according to an embodiment of the present invention.
Figure 4:
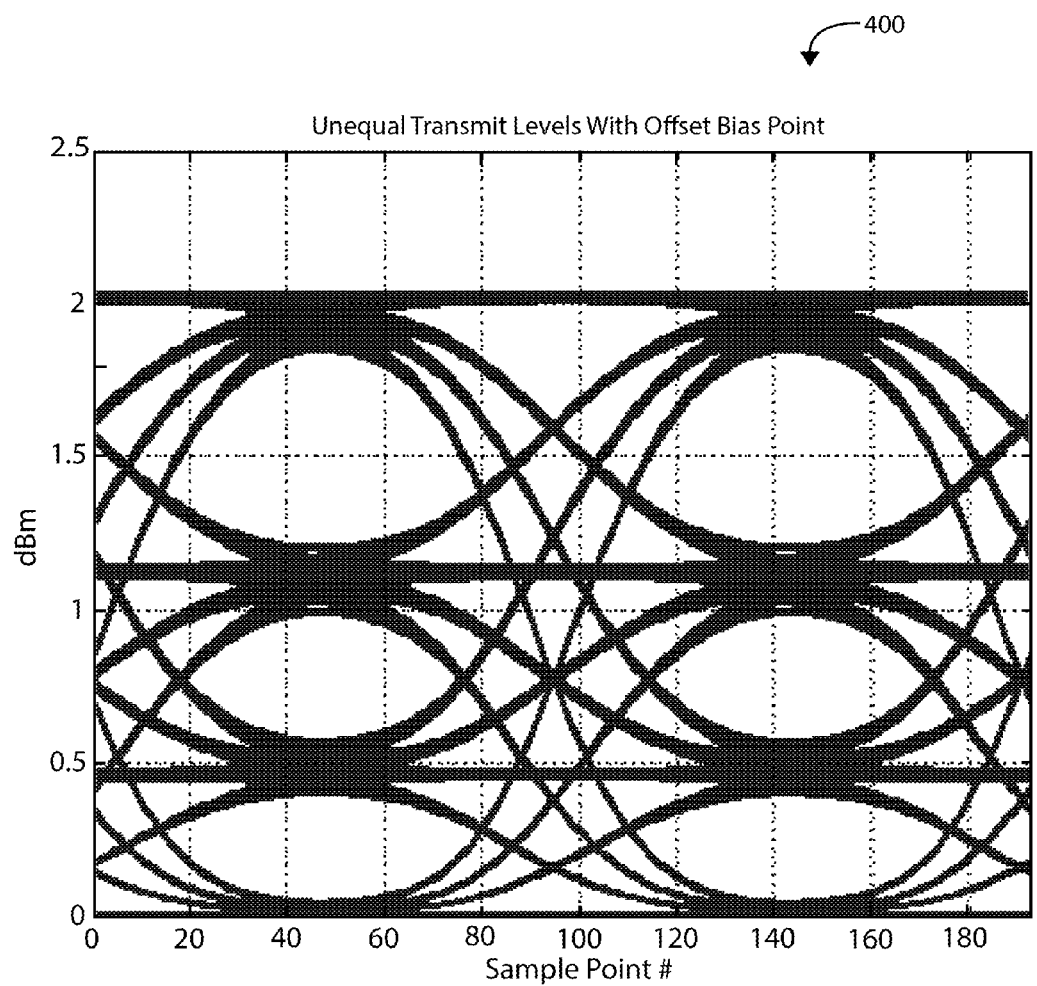
FIG. 4 is a simplified graph representing a signal output for an off-quadrature biased optical modulator device according to an embodiment of the present invention.

The result of this compression function is the compression of the bottom level of the PAM-4 signal and the expansion of the top level of the PAM-4 signal. This result is desirable due to the increased eye opening at the top level, which suffers from the most eye closure, and decreased eye opening at the bottom level, which suffers from the least eye closure. An example of the improvement to the OSNR of an optical modulator is shown in the graph of FIG. 2B. Additionally, FIGS. 3 and 4 show the characteristic difference in a PAM-4 signal between a quadrature biased optical modulator and an off-quadrature biased optical modulator according an embodiment of the present invention.

Figure 2A:
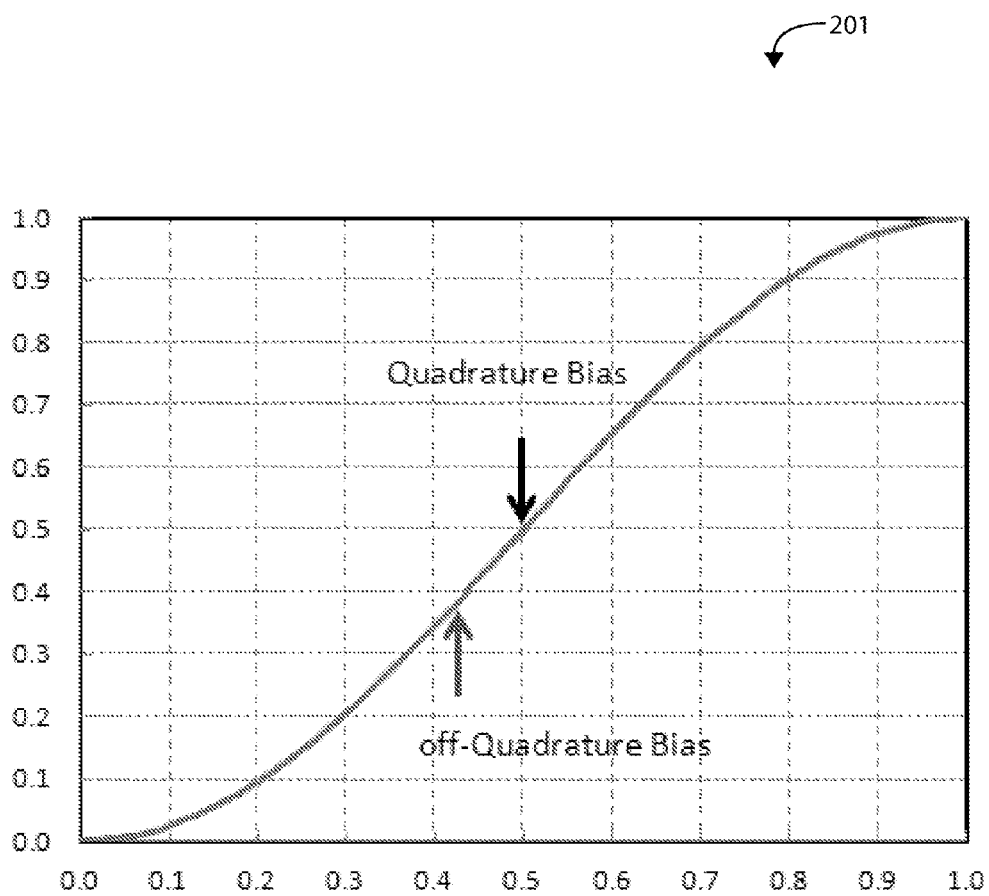
FIG. 2A is a simplified graph showing a comparison of quadrature bias versus off-quadrature bias of a modulator transfer function for an optically amplified system according to an embodiment of the present invention.

FIG. 2A is a simplified graph showing a comparison of quadrature bias versus off-quadrature bias of a modulator transfer function for an optically amplified system according to an embodiment of the present invention. Graph 201 illustrates a modulator transfer curve with a quadrature bias point and an off-quadrature bias point marked on the curve. As discussed previously, a bias compression function can be applied to an optical modulator to expand the top level of an optical signal (e.g. PAM-4) by compressing the bottom level. It is important to note that in biasing the optical modulator to expand the top signal level, the bias function must be towards the downwards direction or towards the null point, which is to compress the bottom or the troughs of the DC transfer curve.

In applied in the upwards direction or the maximum transmission point, the top level would be compressed instead. This result is highly undesirable as there would be greater eye closure as the top level, which already suffers from the greatest eye closure.

FIG. 2B is a simplified graph showing the system Bit Error Rate vs. OSNR (Optical Signal-to-Noise Ratio) for an off-quadrature biased optical modulator device and a quadrature biased optical modulator device according to an embodiment of the present invention. As shown, the graph 202 displays bit error rate, labeled as log 10(Pe), over OSNR measured in dB (decibels). The "equispaced power levels configuration" is represented by the curve marked by "X", and the "unequal power levels by offset bias point" configuration is represented by the curve marked by "O". In this example, a 3.2 dB improvement in OSNR is obtained by use of the offset bias.

FIG. 3 is a simplified graph representing a signal output for a quadrature biased optical modulator device according to an embodiment of the present invention. As shown, the graph 300 shows an example PAM-4 (4-level Pulse Amplitude Modulation) signal according to the equispaced power levels configuration measured in dBm (decibel-milliwatts) over sample point number. Here, the PAM-4 signal displays four signal levels with three equally spaced eye-opening regions. This is the characteristic behavior of a Mach Zehnder Modulator biased at quadrature. FIG. 3 can represent the "equispaced power levels" configuration of FIG. 2.

In order to determine the optimal bias function, the signal noise behavior for an optical modulator can be determined to minimize the noise at the top level. According to an embodiment of the present invention, the noise related to ASE of signal level n of an optical modulator was determined to be proportional to $2\sqrt{n\Delta P_{ASE}}$. Considering the PAM-4 signal example, the noise variances for each of the four signal amplitude levels can be represented by the following equations:

At signal level $0, \sigma_0=0$,

At signal level $\Delta, \sigma_1=2\sqrt{\Delta P_{ASE,R\times BW}}$,

At signal level $2\Delta, \sigma_2=2\sqrt{2\Delta P_{ASE,R\times BW}}$,

At signal level $3\Delta, \sigma_3=2\sqrt{3\Delta P_{ASE,R\times BW}}$, where $P_{ASE,R\times BW}$ is the Amplified Spontaneous Emission Power of the receiver bandwidth.

Thus, an optical modulator can be biased using a bias control module, such as the one shown in FIG. 1, to compress the bottom level or levels of an optical signal to expand the top level or levels in order to minimize the overall signal noise, which is represented by the term $2\sqrt{n\Delta P_{ASE}}$. In a specific embodiment, the individual levels of an optical signal can be reshaped such that the largest eye opening is at the top level and the noise contribution between the various levels are equalized to improve overall system performance.

FIG. 4 is a simplified graph representing a signal output for an off-quadrature biased optical modulator device according to an embodiment of the present invention. As shown, the graph 400 shows an example PAM4 signal according to the unequal power levels by offset bias point configuration. Here, the PAM4 signal displays four signal levels with three eye-openings with the top being expanded and the bottom being compressed. FIG. 4 can represent the "unequal power levels" configuration of FIG. 2.

Figure 5:
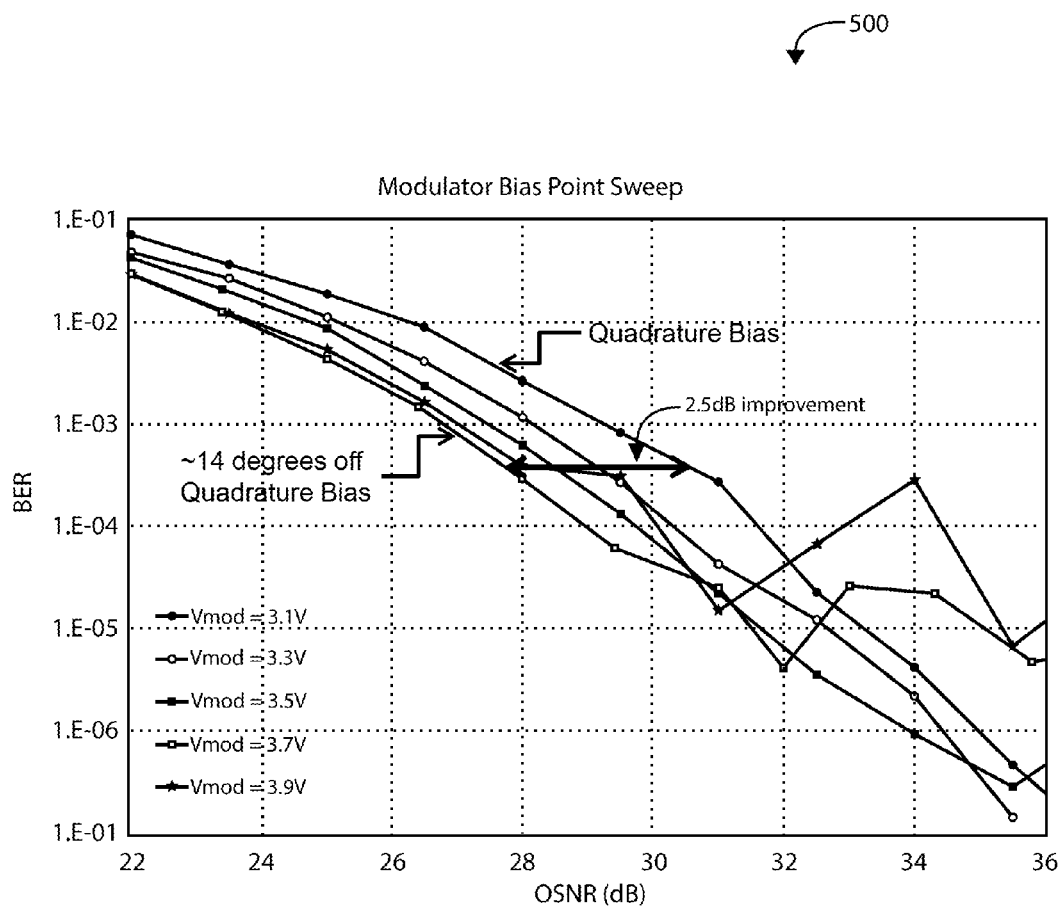
FIG. 5 is a simplified graph showing the OSNR for optical modulator devices configured at various bias points according to embodiments of the present invention.

FIG. 5 is a simplified graph showing the OSNR for optical modulator devices configured at various bias points according to embodiments of the present invention. As shown, the graph 500 shows the result from a modulator bias point sweep measuring BER (Bit Error Rate) over OSNR. Here, bias voltage levels from 3.1V to 3.9V are displayed with each test level represented in the key to the lower left of the graph. In this example, a 2.5 dB improvement over the quadrature bias was found in with an off-quadrature bias of about 14 degrees (corresponding to the 3.7V bias). The off-quadrature bias can be further optimized depending upon application.

In an embodiment, the present invention provides an optical modulator device. The device can include an MZM driver coupled to an MZM. The MZM is characterized by a raised cosine or sine transfer function and is configured for a PAM (Pulse Amplitude Modulation) signal having at least a top eye opening region and a bottom eye opening region. The MZM can be coupled to a light source and a bias control module, which is configured to apply an off-quadrature bias to the optical modulator device. A first VOA coupled to the MZM, and an EDFA coupled to the first VOA and a second VOA. Also, a tunable optical filter can be coupled to the second VOA and an O/E receiver coupled to the filter.

In a specific embodiment, the bias control module is configured to improve an OSNR of the optical modulator device by applying an off-quadrature bias to the optical modulator device. The bias control module is configured to apply the off-quadrature bias to the optical modulator device a DC compression function, which can be an inverse of the transfer function. This compression function is applied to the optical modulator in order to minimize a noise variance associated with the PAM signal that is proportional to $2\sqrt{n\Delta P_{ASE}}$, where $n\Delta$ is signal level n and $P_{ASE}$ is Amplified Spontaneous Emission Power. Furthermore, the bias control module is configured to apply an off-quadrature bias to the optical modulator such that the top eye opening is expanded and the bottom eye opening is compressed and a noise contribution associated with the noise variance for each level of the PAM signal is equalized.

In a specific embodiment, the MZM driver module is configured for a PAM-4 signal modulation characterized by four discrete pulse amplitude levels, including first through fourth amplitude levels, and three eye opening levels, including top, middle, and bottom eye openings. This MZM driver can be a differential input, single-ended output, variable gain, linear driver. Those of ordinary skill in the art will recognize other variations, modifications, and alternatives.

Many benefits are recognized through various embodiments of the present invention. Such benefits include improved system performance due to off-quadrature biasing of an optical modulator device. Embodiments of this off-quadrature bias configuration provide improvements to OSNR (Optical Signal-to-Noise Ratio) of an optical system. Other benefits will be recognized by those of ordinary skill in the art that the mechanisms described can be applied to other optical systems as well. The following description of figures provides additional information relating to an integrated optical system which can incorporate the optical modulator described previously.

Figure 6:
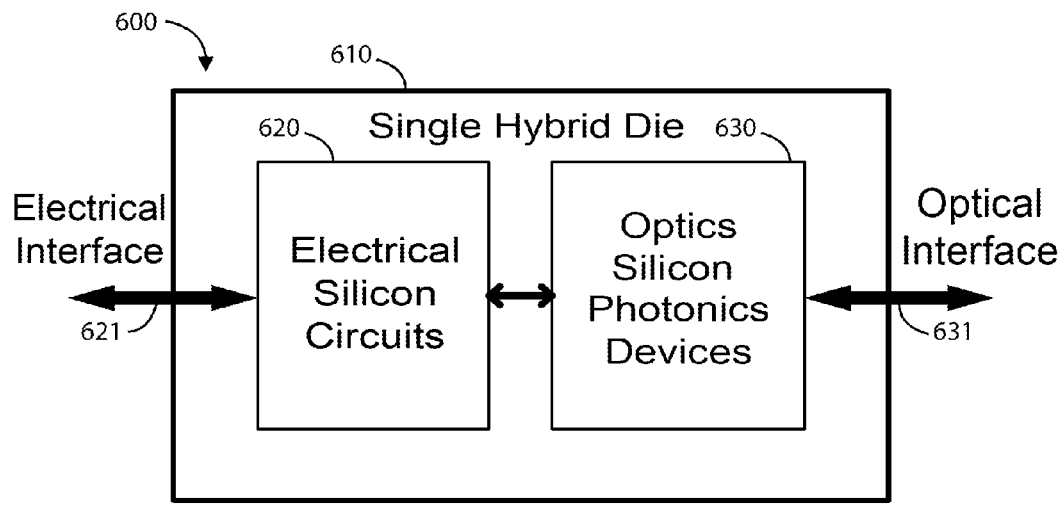
FIG. 6 is a simplified diagram of a single hybrid die (Both electrical and optics devices are fabricated on a single hybrid die) according to an embodiment of the present invention.

FIG. 6 is a simplified diagram of a single hybrid die (Both electrical and optics devices are fabricated on a single hybrid die) according to an embodiment of the present invention. In an example, the present device 600 comprises a single hybrid communication module made of silicon material. The module comprises a substrate member 610 having a surface region, an electrical silicon chip 620 overlying a first portion of the surface region, an silicon photonics device 630 overlying a second portion of the surface region, a communication bus coupled between the electrical silicon chip and the silicon photonics device, an optical interface 621 coupled to the silicon photonics device 630, and an electrical interface 621 coupled to the electrical silicon die 620.

Figure 7:
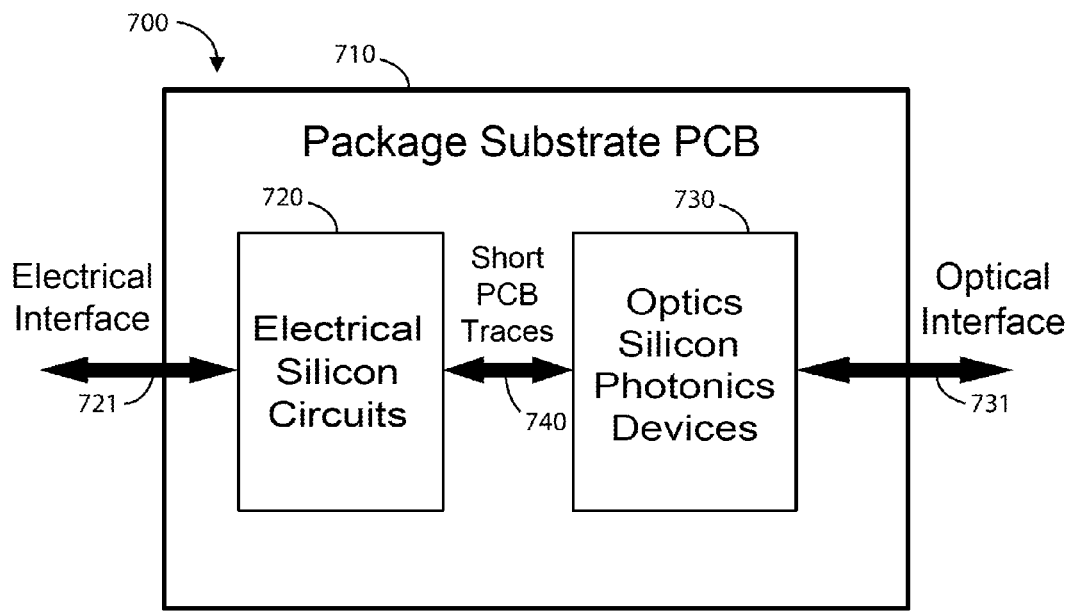
FIG. 7 is a simplified diagram of a multi-chip module according to an embodiment of the present invention.

FIG. 7 is a simplified diagram of a multi-chip module according to an embodiment of the present invention. In an example, the present device 700 comprises a single hybrid communication module. The module comprises a substrate member 710 having a surface region, which can be a printed circuit board or other member. The module comprises an electrical silicon chip 720 overlying a first portion of the surface region, a silicon photonics 730 device overlying a second portion of the surface region, a communication bus 740 coupled between the electrical silicon chip and the silicon photonics device, an optical interface 731 coupled to the silicon photonics device 730, and an electrical interface 721 coupled to the electrical silicon die 720.

Figure 8:
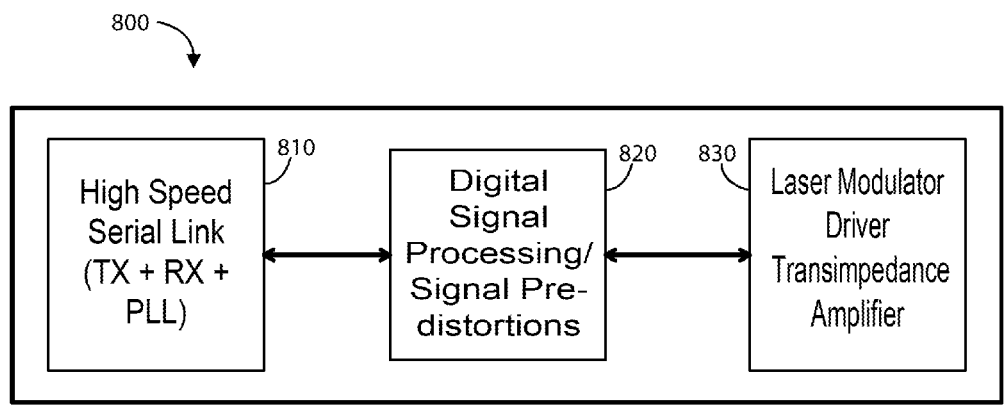
FIG. 8 is a simplified diagram of an electrical silicon die block according to an embodiment of the present invention.

FIG. 8 is a simplified diagram of an electrical silicon die block according to an embodiment of the present invention. As shown, the present device 800 can include a high speed serial link block 810, a digital signal processing/signal pre-distortion block 820, and a laser modulator driver transimpedance amplifier (TIA) 830, or other like devices. In an embodiment, the high speed serial link can include TX line, RX line, and PLL (Phase-Locked Loop) implementations. The serial link block 810 can be coupled to the signal processing module 820, which can be coupled to transimpedance amplifier 830.

Figure 9:
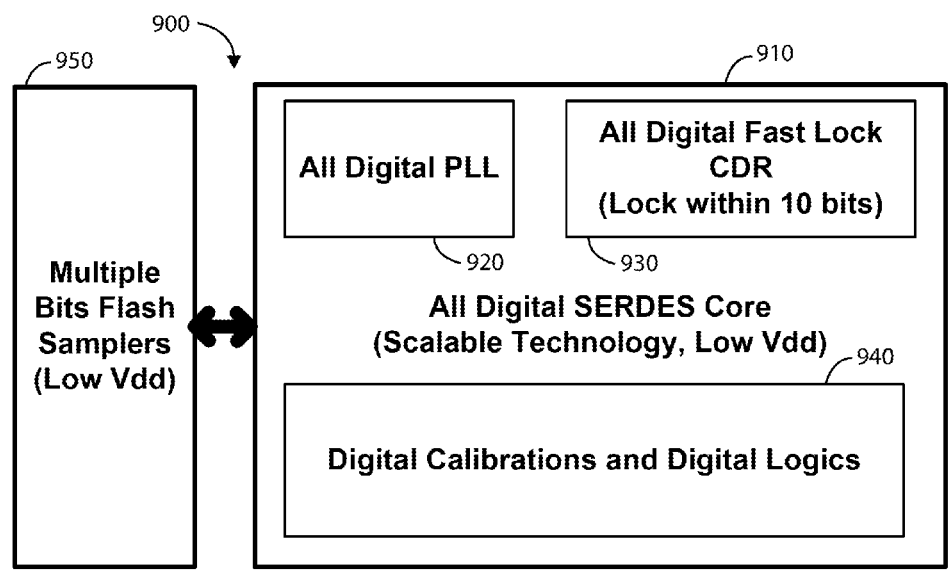
FIG. 9 is a simplified diagram of high speed serial link block according to an embodiment of the present invention.

FIG. 9 is a simplified diagram of high speed serial link block according to an embodiment of the present invention. As shown, the serial link block 900 can include a core 910, which can be an all digital SERDES core. The core 910 can include an all digital PLL 920, and all digital fast lock CDR 930 (Lock within 10 bits), and a digital calibrations and digital logics block 940. The core 910 can be coupled to multiple bits flash samplers 950. In a specific embodiment, the serial link block 810 of FIG. 8 can be configured like block 900.

Figure 10:
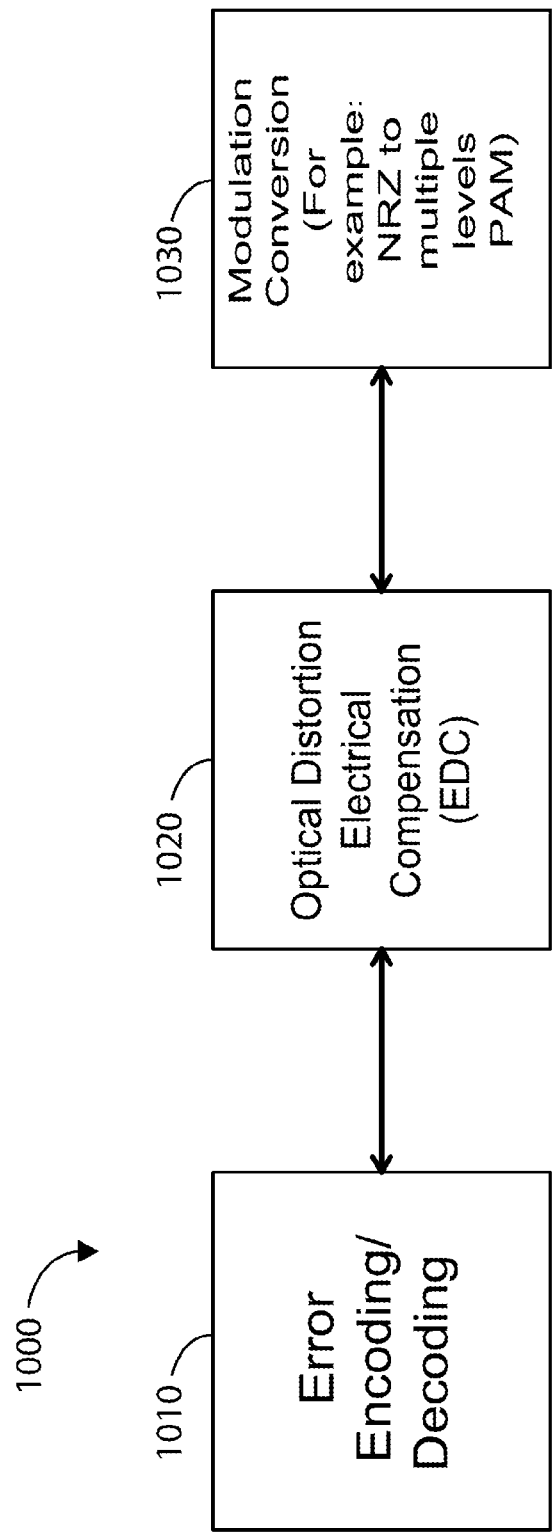
FIG. 10 is a simplified diagram of a digital processing/signal pre-distortion block according to an embodiment of the present invention.

FIG. 10 is a simplified diagram of a digital processing/signal pre-distortion block according to an embodiment of the present invention. As shown, the digital processing/signal pre-distortion block 1000 can include an error encoding/decoding block 1010, an optical distortion electrical compensation (EDC) block 1020, and a modulation conversion block 1030. In an embodiment, the encoding/decoding block 1010 can be coupled to the EDC block 1020, which is coupled to the modulation conversion block 1030. In a specific embodiment, the modulation conversion block 1030 can be configured to convert NRZ to multiple levels PAM. The TIA block 830 of FIG. 8 can be configured like block 1000.

Figure 11:
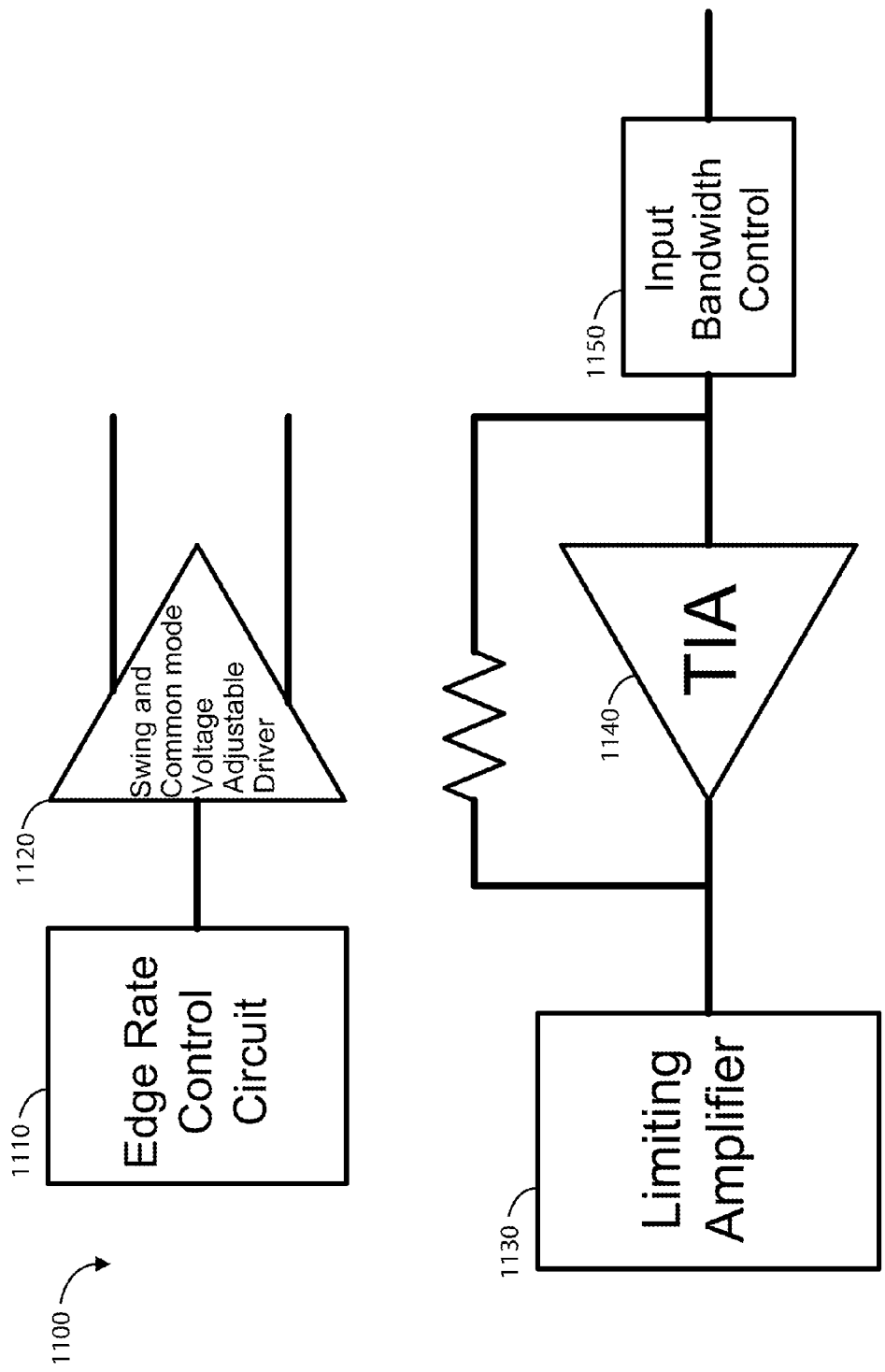
FIG. 11 is a simplified diagram of an electrical laser driver and TIA block diagram according to an embodiment of the present invention.

FIG. 11 is a simplified diagram of an electrical laser driver and TIA block diagram according to an embodiment of the present invention. As shown, the laser driver and TIA block 1100 can include an edge rate control circuit 1110 coupled to a swing and common mode voltage adjustable driver 1120. The driver and TIA block 1100 can also include a limiting amplifier 1130 coupled to a TIA 1140, which can be coupled to an input bandwidth control block 1150. Other configurations may be used as well.

Figure 12:
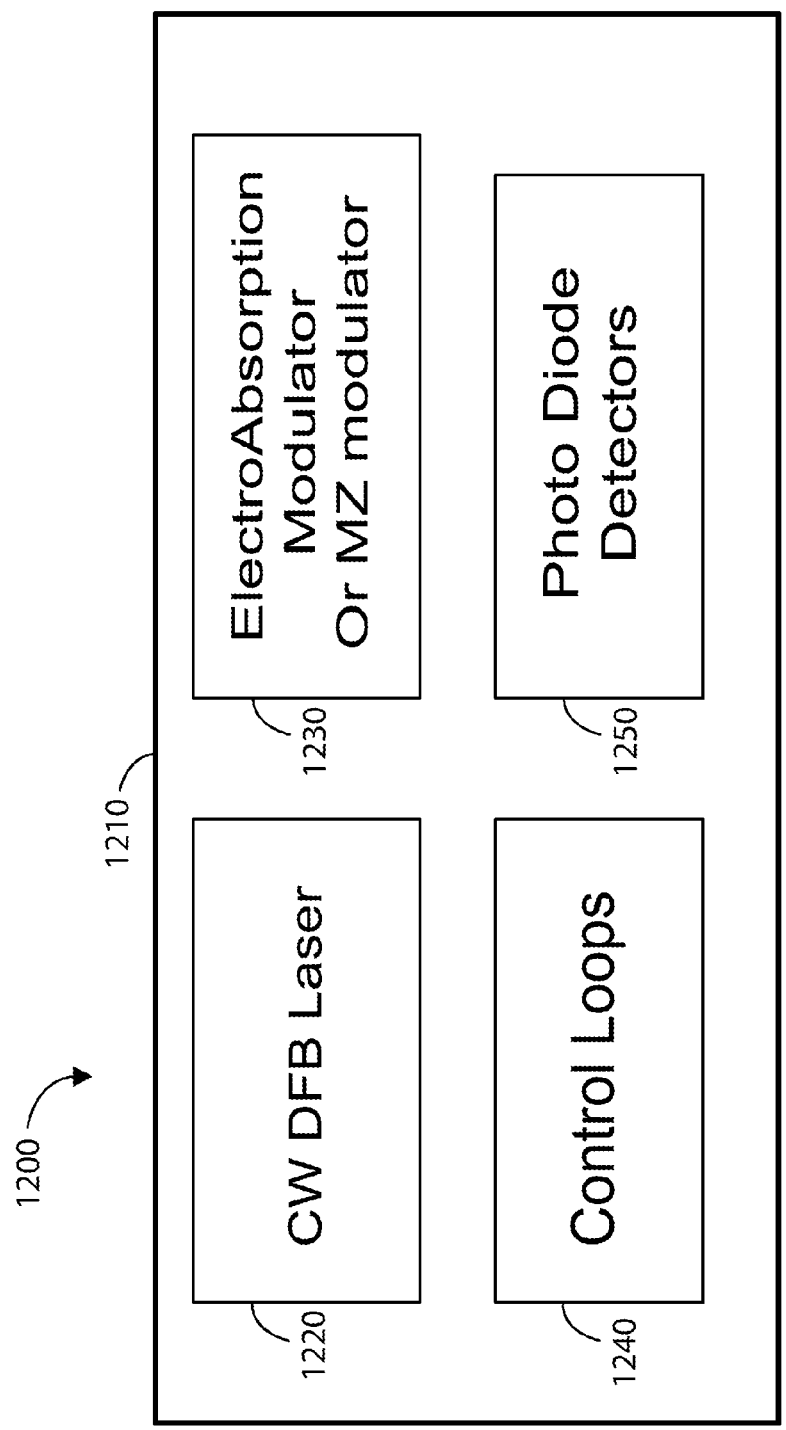
FIG. 12 is a simplified diagram of a silicon photonic block diagram according to an embodiment of the present invention.

FIG. 12 is a simplified diagram of a silicon photonic block diagram according to an embodiment of the present invention. As shown, the silicon photonics block 1200 can include a substrate 1210, a continuous wave (CW) distributed feedback (DFB) laser block 1220, an electro-absorption modulator or MZ modulator 1230, control loops 1240, and photo diode detectors 1250. Other variations, modifications, and alternatives will be recognized by those skilled in the art.

Figure 13:
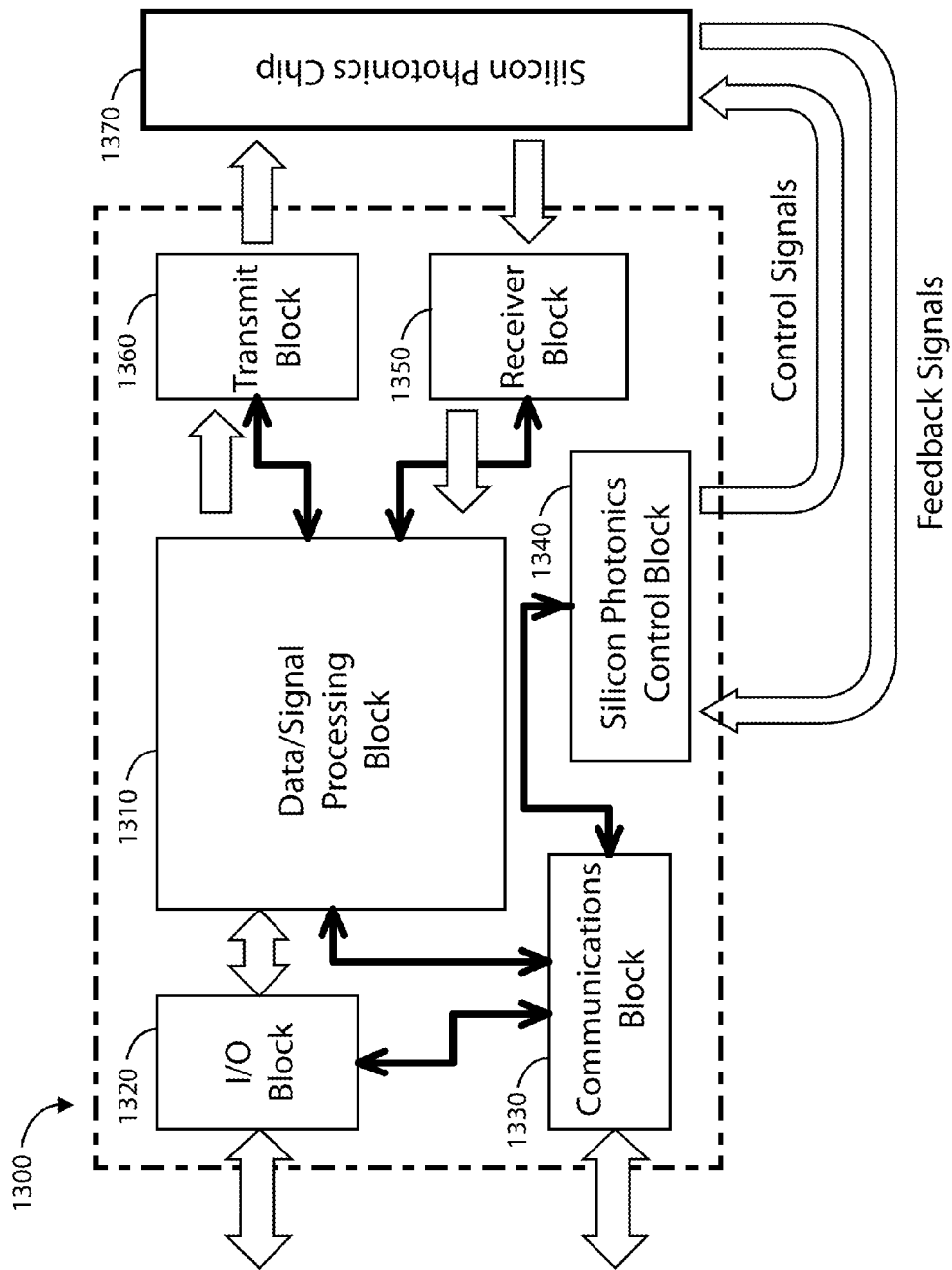
FIG. 13 is a simplified block diagram of a multi-chip module according to an alternative embodiment of the present invention.

FIG. 13 is a simplified block diagram of a multi-chip module according to an alternative embodiment of the present invention. As shown, the present invention includes an integrated system on chip device. The device 1300 is configured on a single silicon substrate member. The device has a data input/output interface provided on the substrate member and configured for a predefined data rate and protocol. The device has an input/output block 1320 provided on the substrate member and coupled to the data input/output interface. In an example, the input/output block 1320 comprises a SerDes block, a CDR block, a compensation block, and an equalizer block, among others. The device has a signal processing block 1310 provided on the substrate member and coupled to the input/output block 1320. In an example, the signal processing block 1310 is configured to the input/output block 1320 using a bi-direction bus in an intermediary protocol. The device has a driver module 1360 provided on the substrate member and coupled to the signal processing block. In an example, the driver module 1360 is coupled to the signal processing block 1310 using a uni-directional multi-lane bus. In an example, the device has a driver interface provided on the substrate member and coupled to the driver module 1360 and configured to be coupled to a silicon photonics device 1370. In an example, the driver interface is configured to transmit output data in either an amplitude modulation format or a combination of phase/amplitude modulation format or a phase modulation format. In an example, the device has a receiver module 1350 comprising a TIA block provided on the substrate member and to be coupled to the silicon photonics device 1370 using predefined modulation format, and configured to the digital signal processing block 1310 to communicate information to the input output block 1320 for transmission through the data input/output interface. In an example, the device has a communication block 1330 provided on the substrate member and operably coupled to the input/output block 1320, the digital signal processing block 1310, the driver block 1360, and the receiver block 1350, among others. The device has a communication interface coupled to the communication block 1330. The device has a control block 1340 provided on the substrate member and coupled to the communication block 1330.

In an example, the signal processing block 1310 comprises a FEC block, a digital signal processing block, a framing block, a protocol block, and a redundancy block, among others. The driver module 1360 is selected from a current drive or a voltage driver in an example. In an example, the driver module is a differential driver or the like. In an example, the silicon photonics device 1370 is selected from an electro absorption modulator or electro optic modulator, or a Mach-Zehnder. In an example, the amplified modulation format is selected from NRZ format or PAM format. In an example, the phase modulation format is selected from BPSK or nPSK. In an example, the phase/amplitude modulation is QAM. In an example, the silicon photonic device 1370 is configured to convert the output data into an output transport data in a WDM signal. In an example, the control block 1340 is configured to initiate a laser bias or a modulator bias. In an example, the control block 1340 is configured for laser bias and power control of the silicon photonics device. In an example, the control block 1340 is configured with a thermal tuning or carrier tuning device each of which is configured on the silicon photonics device. In an example, the SerDes block is configured to convert a first data stream of N into a second data stream of M.

Figure 14:
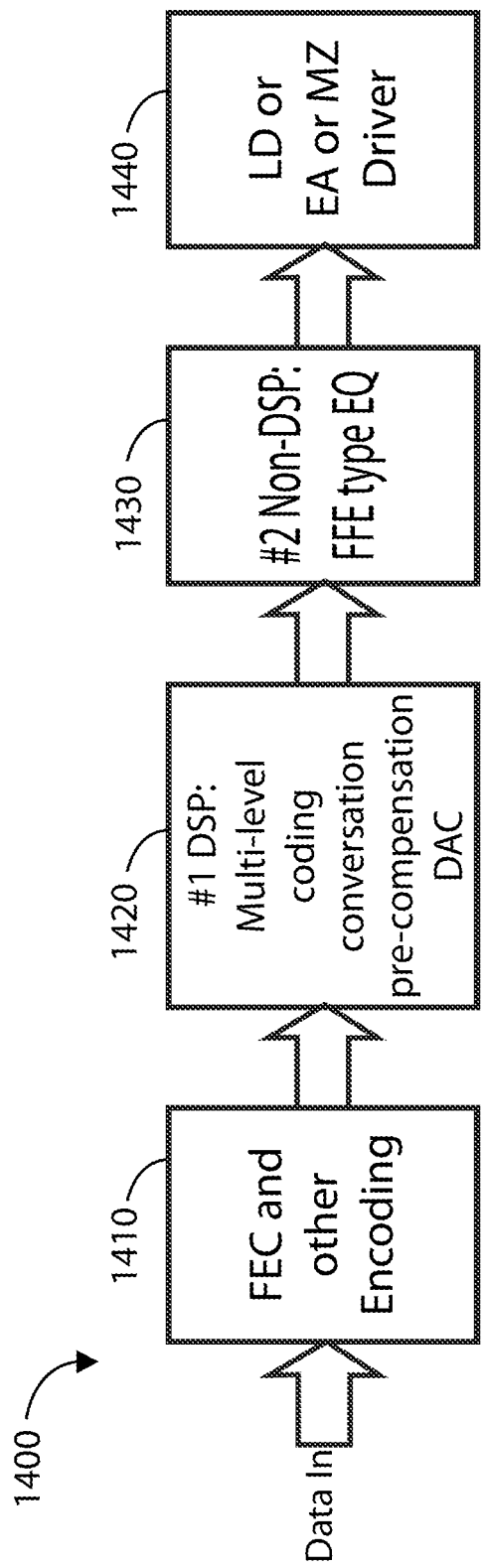
FIG. 14 is a simplified block diagram of data flow according to an embodiment of the present invention.

FIG. 14 is a simplified block diagram of data flow according to an embodiment of the present invention. As show is a stream of incoming data, which processed through multiple blocks. The blocks include, among others, forward error correction 1410, and other encoding, multi-level coding 1420, pre-compression, and digital to analog coding. The blocks also include non-DSP forward error correction 1430, and a block corresponding to a laser diode or driver 1440, among others. In an example, in the absence of a FEC from a host process, techniques include use an FEC internal to the CMOS chip. In an example, FEC can be striped across each or all of data lanes. Of course, there can be variations, modifications, and alternatives.

Figure 15:
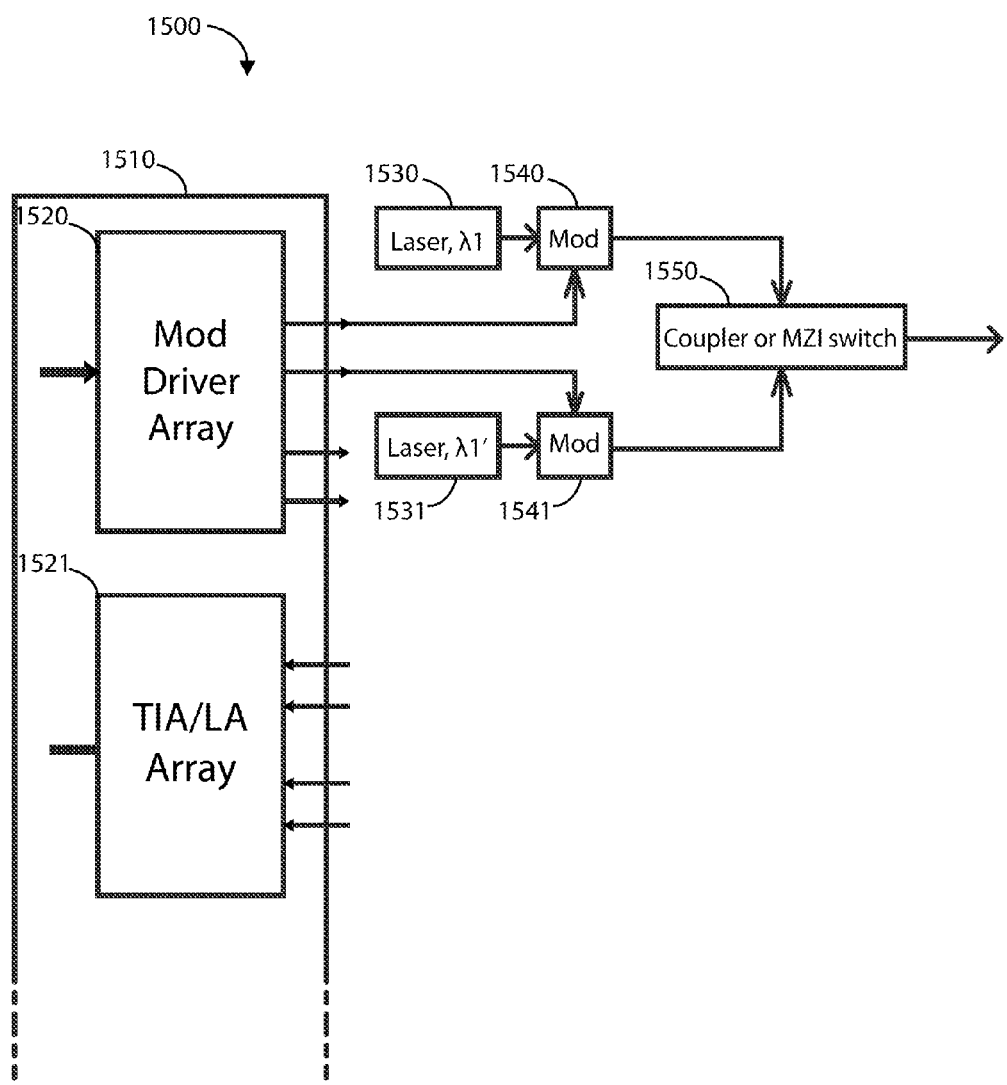
FIG. 15 is a simplified diagram illustrating a redundant laser configuration at a drive stage according to an embodiment of the present invention.

FIG. 15 is a simplified diagram illustrating a redundant laser configuration 1500 at a drive stage according to an embodiment of the present invention. In an example, the invention provides an integrated system on chip device 1510 having a redundant laser or lasers configured for each channel. The device 1510 can have a mod driver array 1520 and a TIA/LA array 1521. In an example, the device 1500 has a plurality of laser devices configured on the silicon photonics device. At least a pair of laser devices 1530, 1531 is associated with a channel and coupled to a switch 1550 to select one of the pair of laser devices to be coupled to an optical multiplexer to provide for a redundant laser device.

Figure 16:
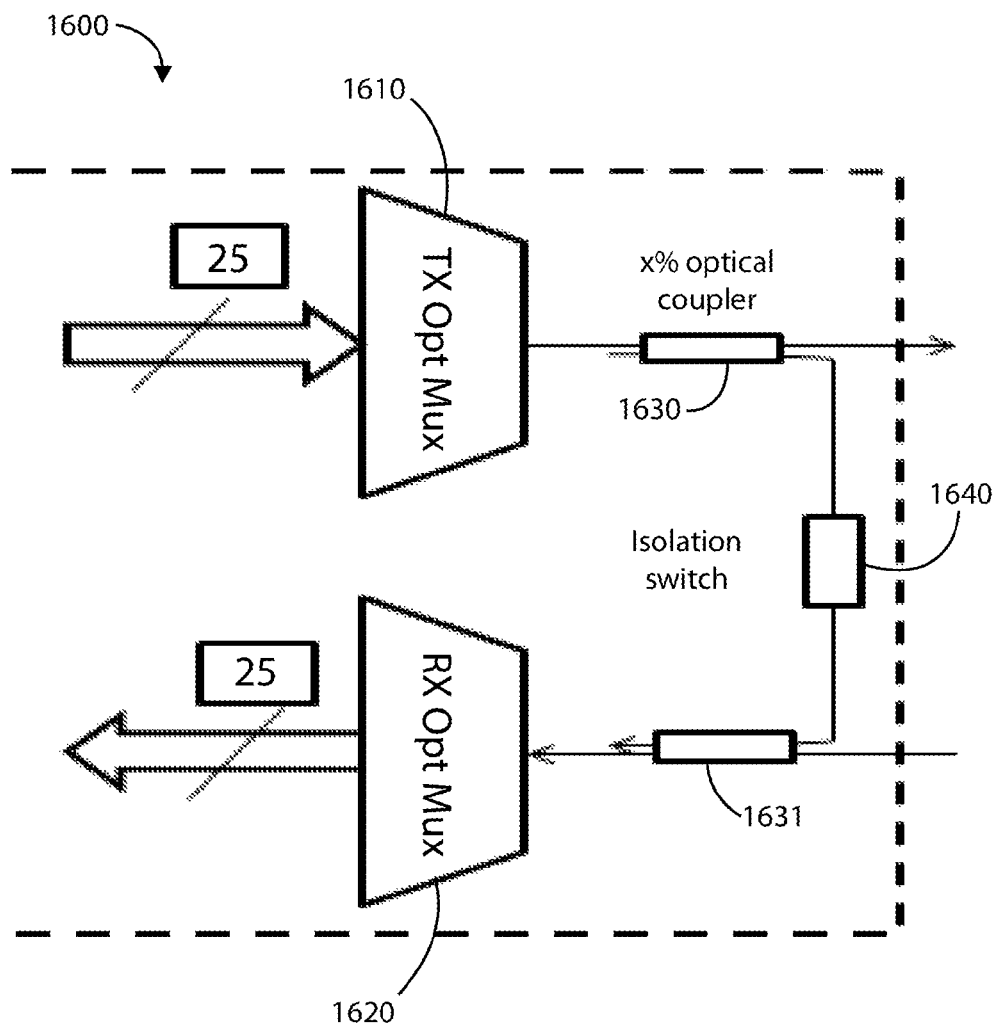
FIG. 16 is a simplified diagram illustrating a built-in self test using an optical loop back according to an embodiment of the present invention.

FIG. 16 is a simplified diagram illustrating a built-in self test using an optical loop back according to an embodiment of the present invention. As shown are a TX multiplexer 1610 and an RX multiplexer 1620 for a silicon photonics device. In an example, the present invention provides an integrated system on chip device having a self test using a loop back technique. In an example, the device has a self-test block provided on the substrate. In an example, the self test block is configured to receive a loop back signal from at least one of the digital signal processing block, the driver module, or the silicon photonics device. In an example, the self test block comprises a variable output power switch configured to provide a stress receiver test from the loop back signal. Also shown is an isolation switch 1640 between RX and TX. Optical couplers 1630 and 1631 are coupled to the TX Mux and RX Mux, respectively, as well as the isolation switch 1640.

In an example, the present technique allows a loop back test capability on the device, which is now a silicon photonic application specific integrated circuit or a communication system on chip device, as described. In an example, the technique is provided for diagnostic and setup during power up sequence. In an example, an optical tap coupler on the output side connected to the input side as shown. In an example, as shown, x (e.g., <10%) is selected to reduce and/or minimize an impact an output power as well an impact at the input power given that input power is generally much lower than the output power. In an example, to prevent crosstalk in the present loop back path, an isolation switch has been configured as shown. In an example, without the isolation switch there is undesirably direct crosstalk between the output and input as shown. In an example, about 30 dB isolation is included to prevent deleterious effects of coherent crosstalk. Of course, there can be variations.

Figure 17:
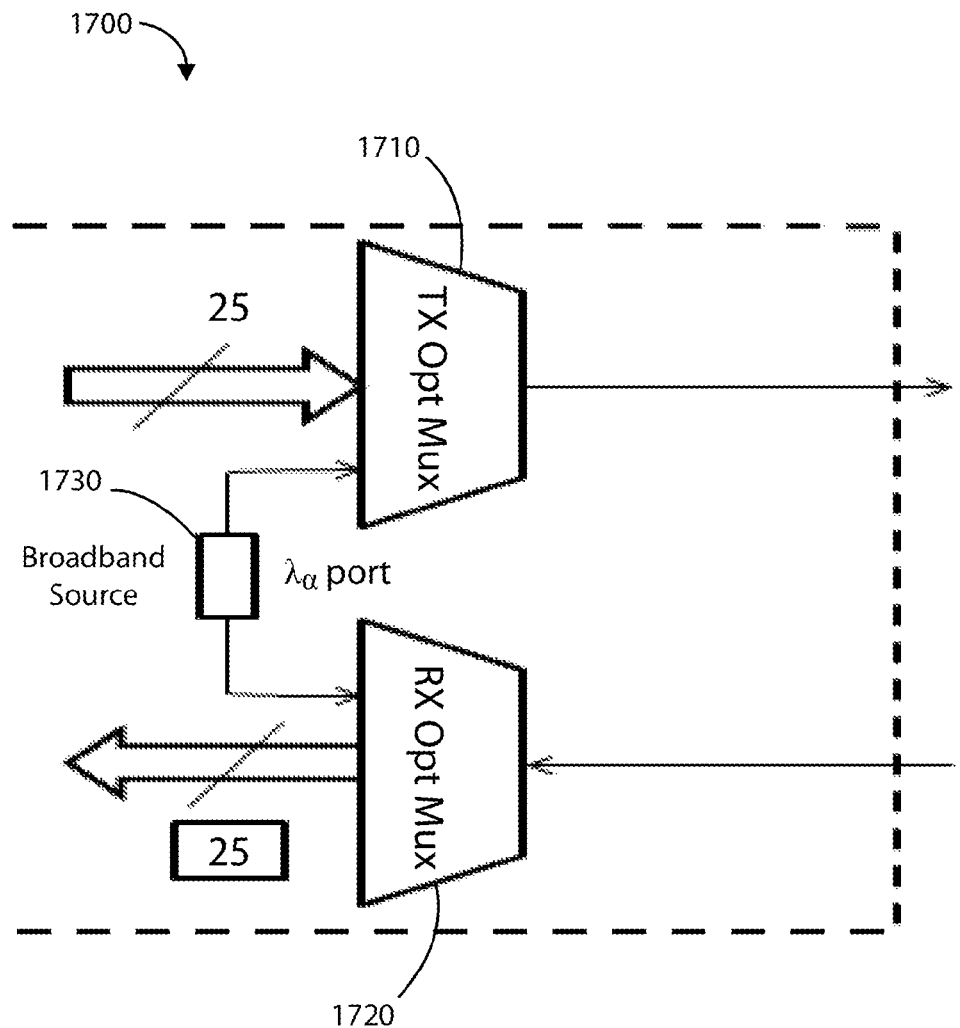
FIG. 17 is a simplified diagram illustrating a built-in self test configured for optical testing according to an embodiment of the present invention.

FIG. 17 is a simplified diagram illustrating a built-in self test configured for optical testing according to an embodiment of the present invention. In an example, the present invention provides an integrated system on chip device having a built-in self test technique. As shown are a TX multiplexer 1710 and an RX multiplexer 1720 for a silicon photonics device 1700. A broad band source 1730 is coupled to each of the multiplexers. Multiple sources can also be included. In an example, the device has a self test block configured on the silicon photonics device and to be operable during a test operation. In an example, the self test block comprises a broad band source configured to emit electromagnetic radiation from 1200 nm to 1400 nm or 1500 to 1600 nm to a multiplexer device. In an example, the broad band source 1730 can be an LED or other suitable device. The device also includes a self test output configured to a spectrum analyzer device external to the silicon photonics device. In an example, the technique can be provided during a calibration process. That is, if after calibration, a center X of each multiplexer changed, the present technique including built-in light source will quantify or indicate the change in an example. In an example, the broadband source in silicon photonics is a light source with no optical feedback, although there can be variations.

Figure 18:
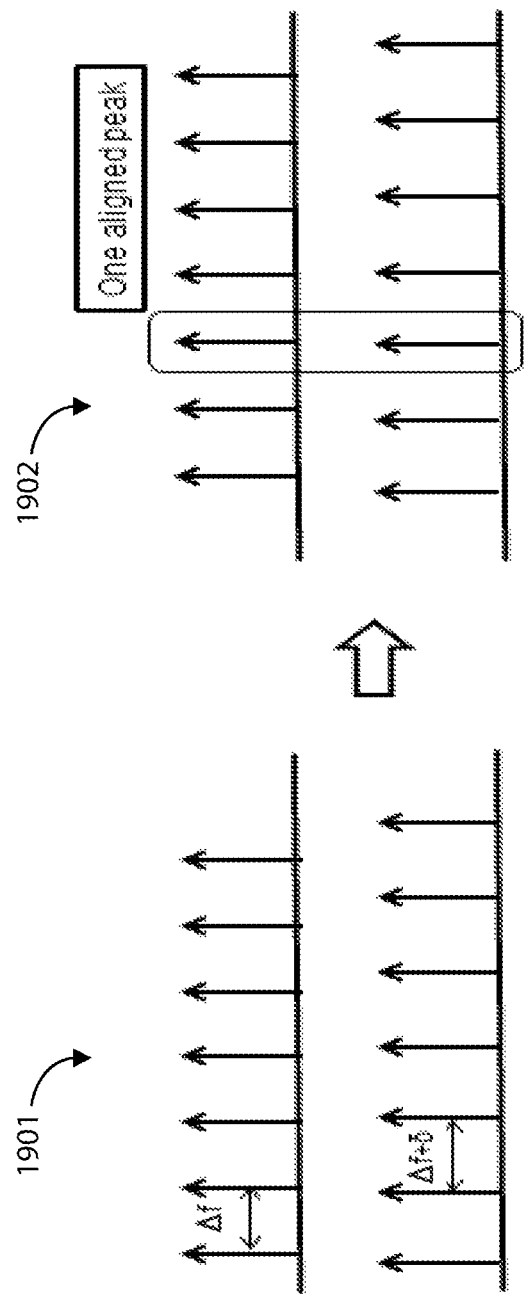
FIG. 18 is a simplified diagram illustrating wavelength tuning configured to silicon photonic device according to an embodiment of the present invention.

FIG. 18 is a simplified diagram illustrating wavelength tuning configured to silicon photonic device according to an embodiment of the present invention. In an example, the present tunable laser uses a set of rings or gratings with resonant frequencies that a slightly different. In an example, the technique use a vernier effect to tune the laser over a wide frequency range—limited by the bandwidth of the gain region. In an example, the vernier desirably would be held in lock with respect to one another. In an example, the technique uses a dither frequency on one of the biases (e.g., heater) and lock the ring to the maximum transmission of the second ring or grating, although there can be variations. As shown in graph 1901, resonant combs are generally misaligned in an example. When tuned, thermally or otherwise, techniques can be used to selectively align one of the combs to another comb or spatial reference as shown in graph 1902. In an example, to maintain alignment, the technique dithers the signal to one of the rings. Of course, there can be variations, alternatives, and modifications.

Figure 19:
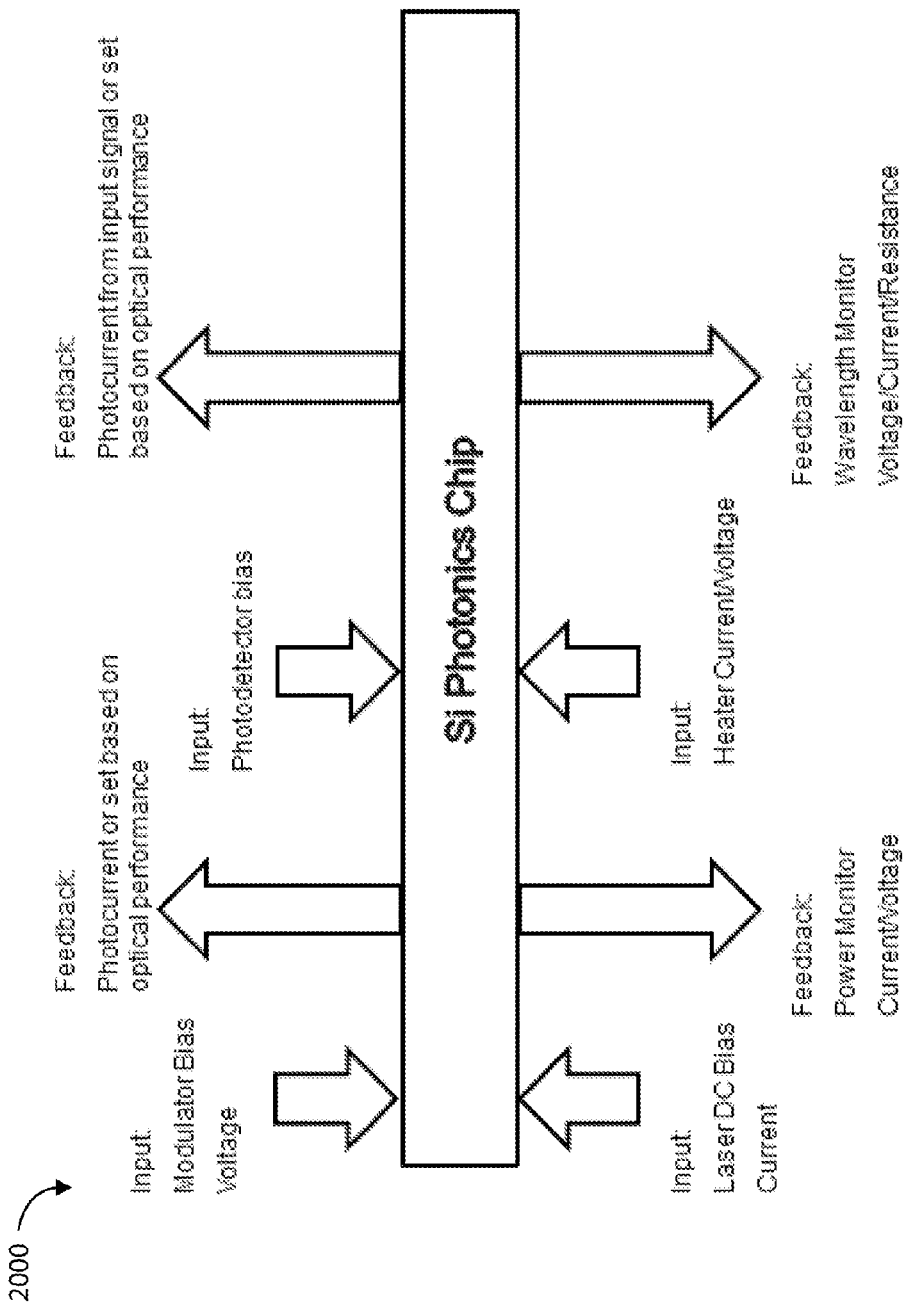
FIG. 19 is a simplified block diagram of an interface for a silicon photonics device according to an embodiment of the present invention.

FIG. 19 is a simplified block diagram of an interface for a silicon photonics device according to an embodiment of the present invention. In an example, the interface is provided to communicate between the control block and the silicon photonics device. The interface includes one or more of a modulator bias voltage input, a laser DC bias current input, a photocurrent or set output, a power monitor current/voltage output, a photodetector bias input, a heater current/voltage input, a photocurrent from input signal or set output, a wavelength monitor voltage/current/resistance output, among other elements. Of course, there can be variations.

Figure 20:
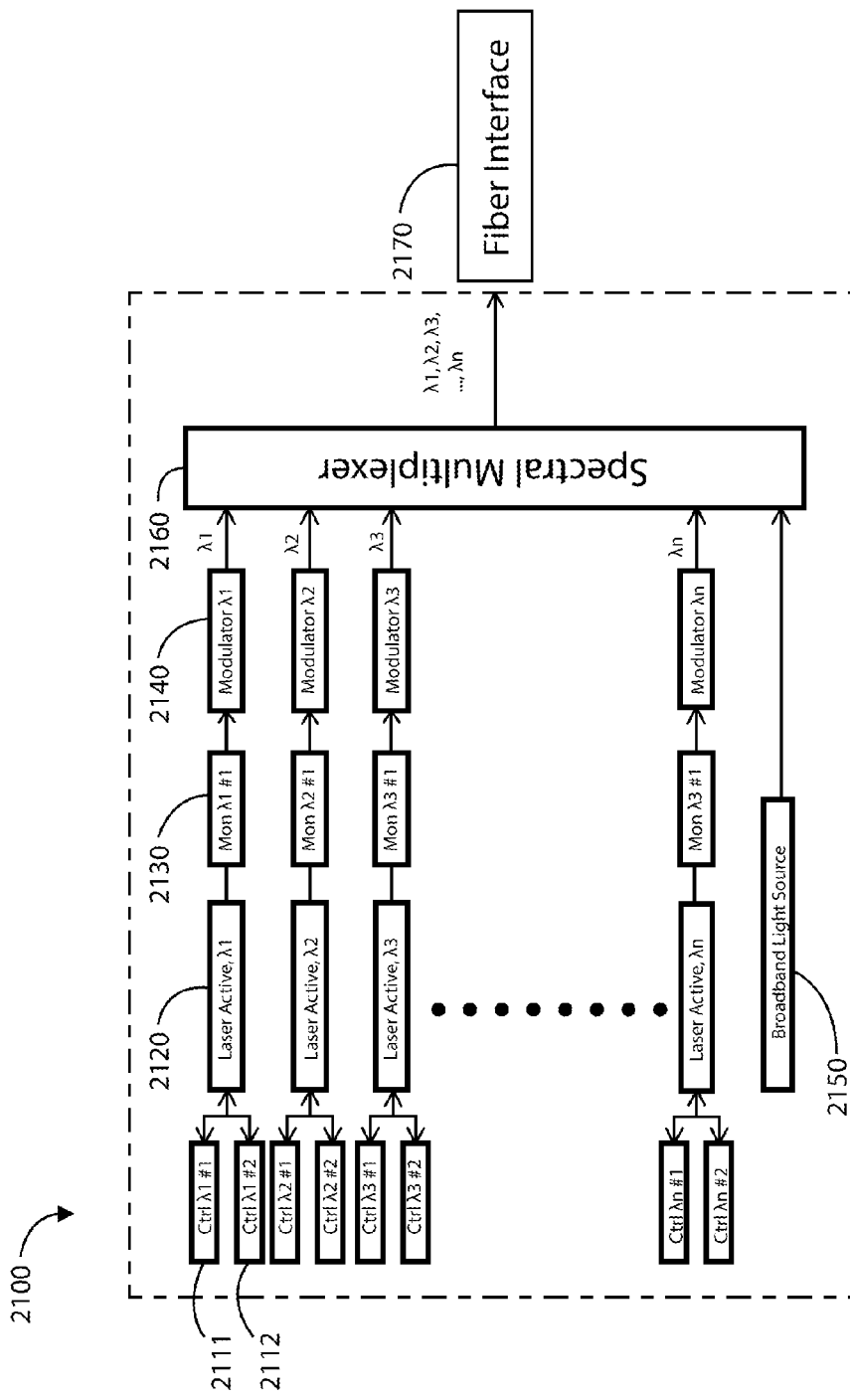
FIG. 20 is a simplified diagram illustrating a laser configuration at a transmitter side of a silicon photonics device according to an embodiment of the present invention.

FIG. 20 is a simplified diagram illustrating a laser configuration at a transmitter side of a silicon photonics device according to an embodiment of the present invention. As shown are a plurality of laser devices 2120 numbered from wavelength 1 to n, each of which has a modulator device 2140, and are collectively coupled to a spectral multiplexer 2160. Each of the laser devices 2120 are coupled to a pair of control blocks, such as blocks 2111 and 2112, and monitor blocks 2130. The spectral multiplexer 2160 is coupled to a fiber interface 2170. As shown is a broad band source 2150, as previously noted.

Figure 21:
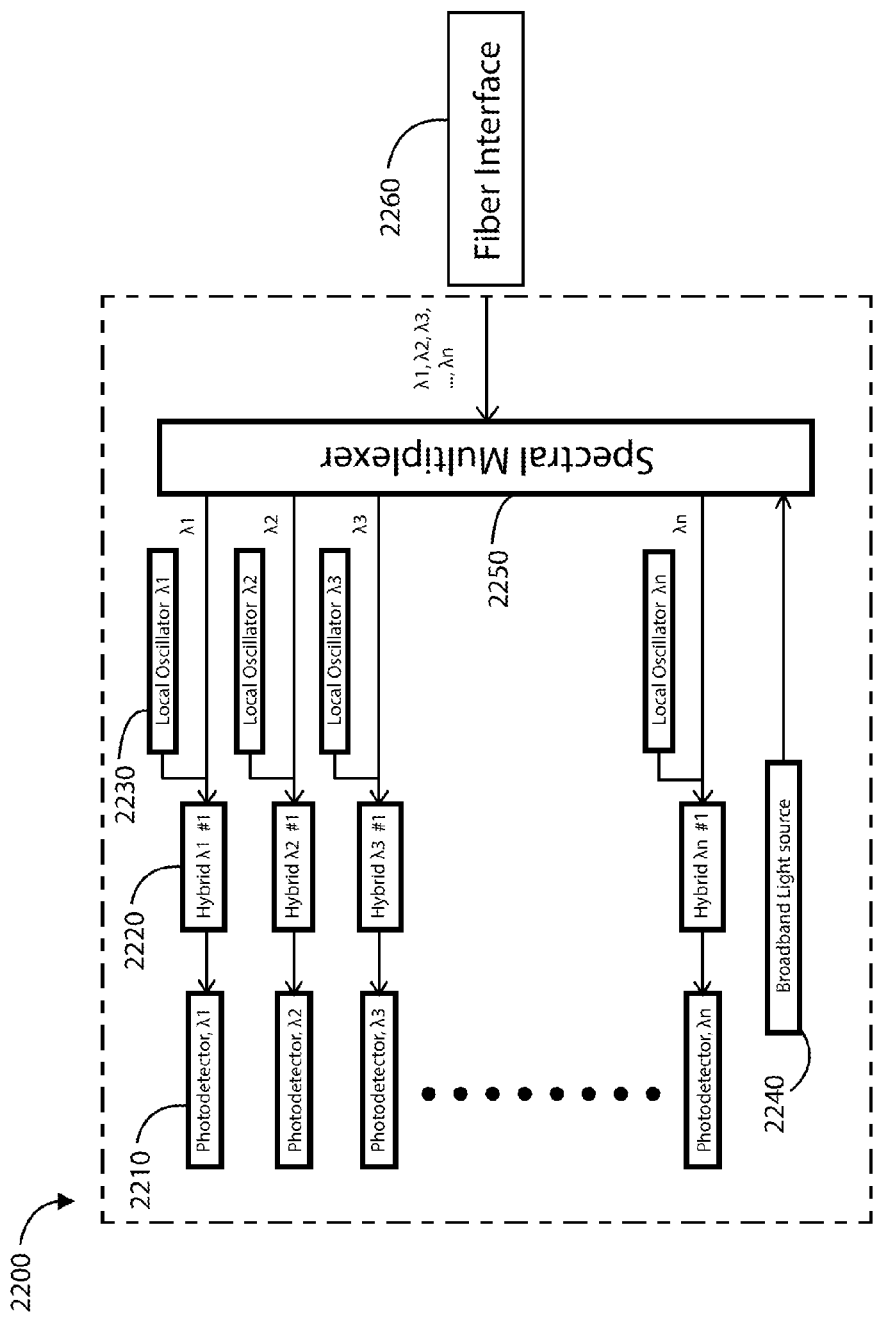
FIG. 21 is a simplified diagram illustrating a laser configuration at a receiver side of a silicon photonics device according to an embodiment of the present invention.

FIG. 21 is a simplified diagram illustrating a laser configuration at a receiver side of a silicon photonics device according to an embodiment of the present invention. As shown are a plurality of detectors 2210 numbered from wavelength 1 to n, each of which has a oscillator device 2230, and are collectively coupled to a spectral multiplexer 2250. Each of the photodetector blocks 2210 can be coupled to hybrid blocks 2220. The spectral multiplexer is coupled to a fiber interface 2260. As shown is a broad band source 2240, as previously noted.

Figure 23:
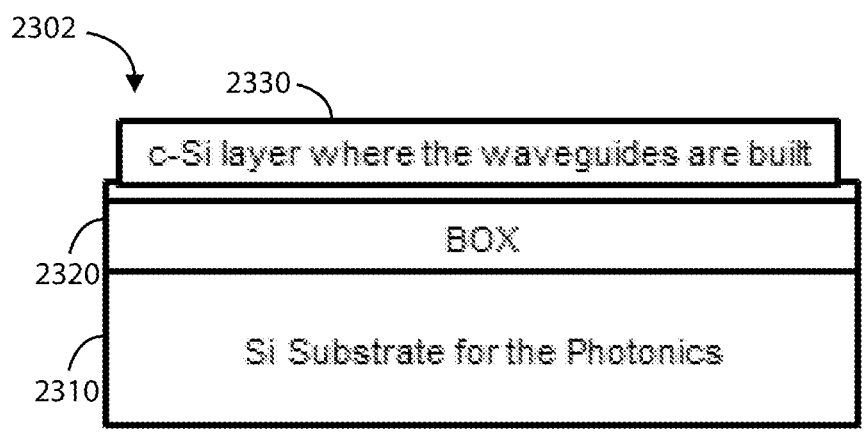
FIGS. 22 and 23 are simplified diagrams illustrating a hybrid light source for a silicon photonics device according to an embodiment of the present invention.
Figure 22:
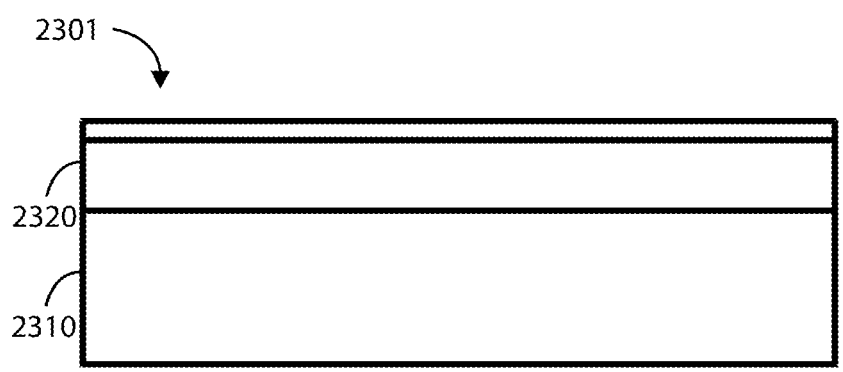

FIGS. 22 and 23 are simplified diagrams illustrating a hybrid light source for a silicon photonics device according to an embodiment of the present invention. As shown in FIG. 22, device 2301 includes a silicon substrate 2310 for photonics devices, and an overlying buried oxide region 2320. In FIG.

23, device 2302 includes the same substrate 2310 and buried oxide region 2320, and also includes an overlying crystalline silicon material 2330 configured for a waveguide or guides. Of course, there can be other variations, modifications, and alternatives.

FIG. 23 is a simplified diagram illustrating a wavelength control and locking configuration with a silicon photonic device according to an embodiment of the present invention. As shown, device 2401 shows a laser device coupled to control blocks, and a modulator block. Drivers #1 and #2 are coupled to the control blocks #1 and #2. A fixed bias setting is coupled to driver #2, whereas a variable bias setting is coupled to driver #1. The monitor block coupled to the modular and laser device is also coupled in series to a photocurrent detect circuit to TIA with bandwidth 2f-4f block, where the dither frequency is f, a minimum detect circuit to derivative block, and the variable bias setting block. Graph 2402 shows the signal at the monitor #1 block when dither is applied, showing the derivative signal in the bottom graph. Graph 2403 shows the effect of applying dither to one comb on the wavelengths produced. This self-test configuration can also be used in the detections of the odd harmonics.

Figure 24:
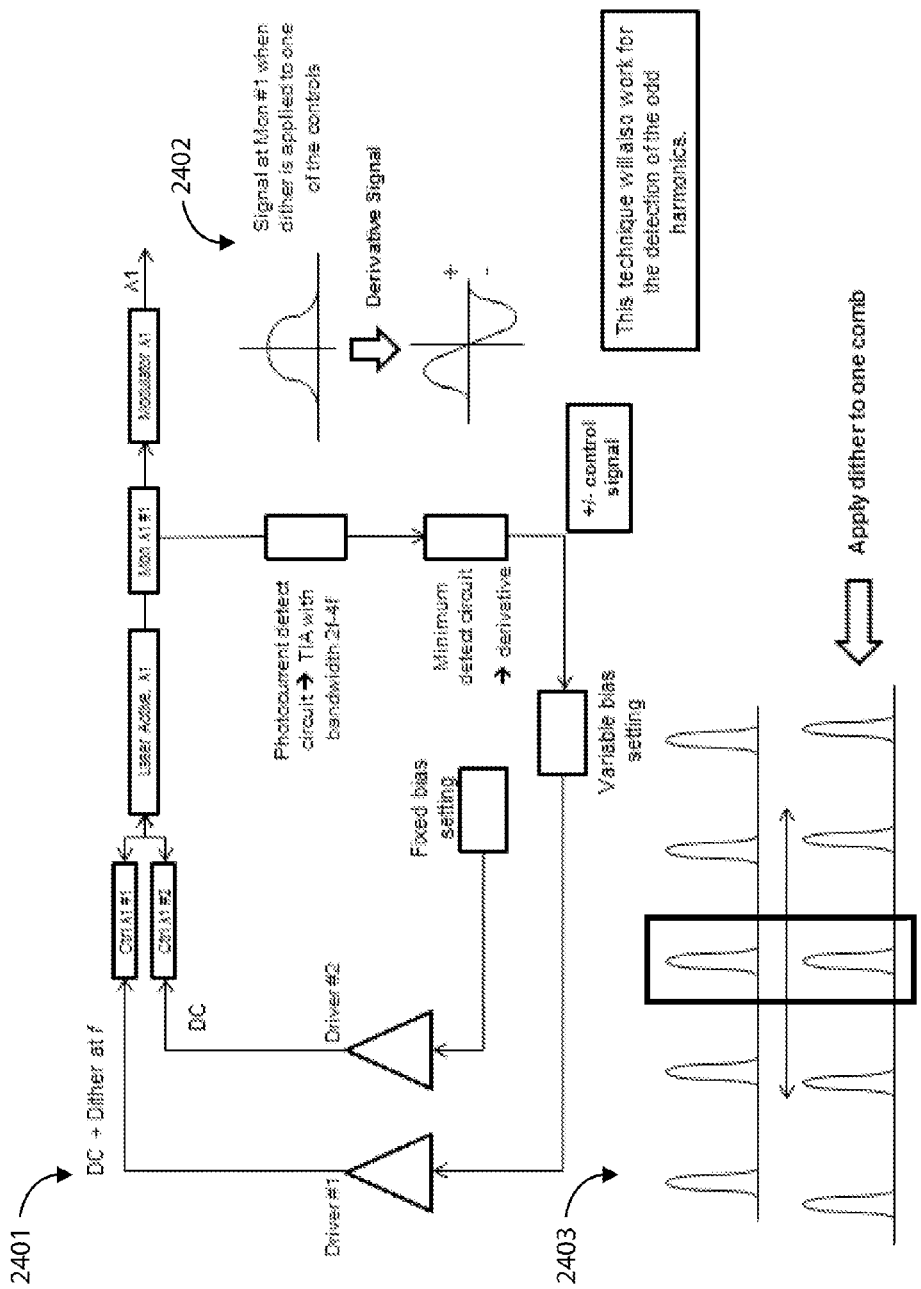
FIG. 24 is a simplified diagram illustrating a wavelength control and locking configuration with a silicon photonic device according to an embodiment of the present invention.
Figure 25:
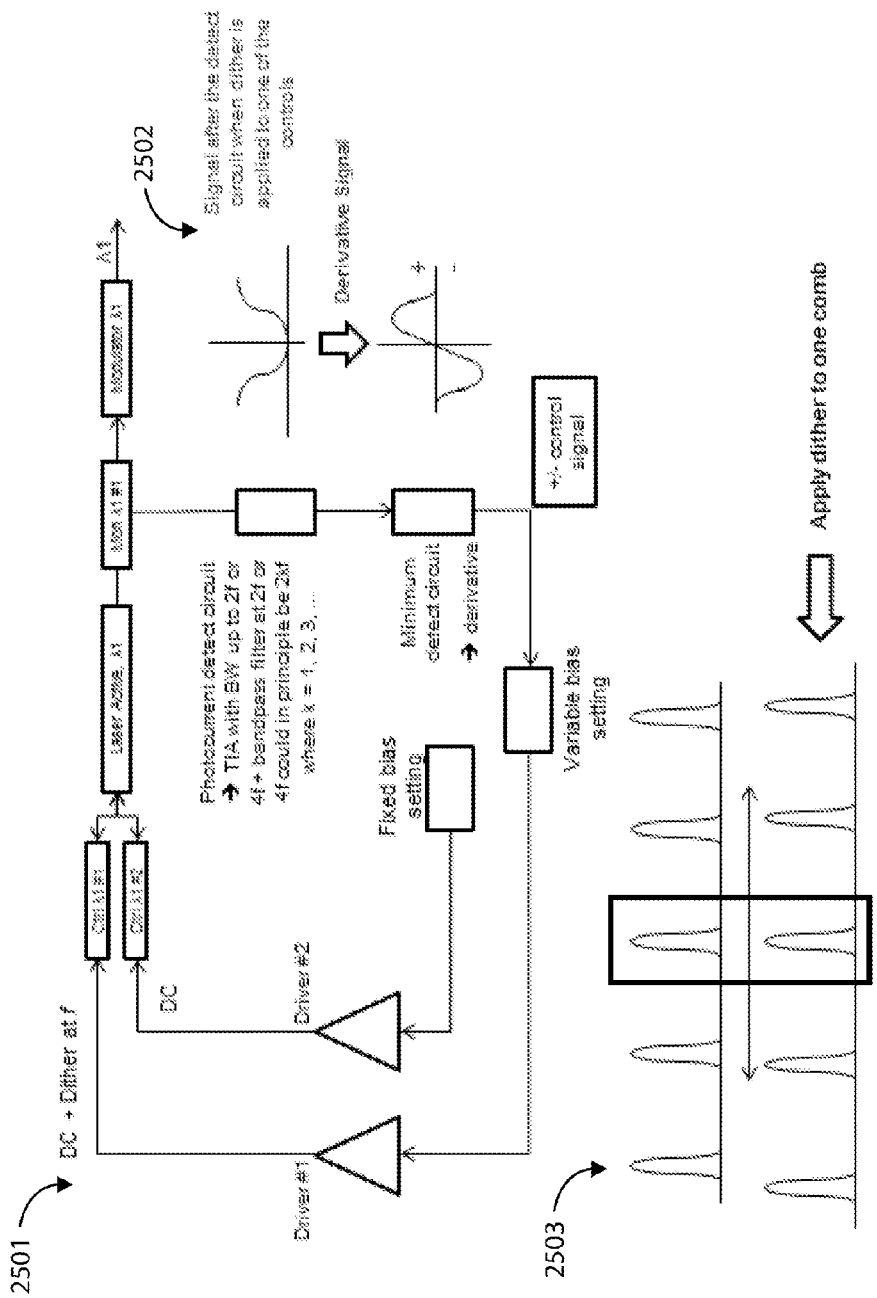
FIG. 25 is a simplified diagram illustrating a wavelength control and locking configuration with a silicon photonics device according to an alternative embodiment of the present invention.

FIG. 24 is a simplified diagram illustrating a wavelength control and locking configuration with a silicon photonics device according to an alternative embodiment of the present invention. The device of 2501 shows a similar configuration to device 2401 of FIG. 24. Here, the photocurrent detect circuit includes a TIA with BW up to 2f or 4d with a band pass filter at 2f or 4f (which can be 2kf, where k=1, 2, 3, etc.) Graph 2502 shows the signal after the detect circuit when dither is applied to one of the controls. Graph 2503 shows the application of dither to one comb, similar to graph 2403 of FIG. 23.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical modulator device, the device comprising:
   a driver module;
   an optical modulator coupled to the driver module, the optical modulator being characterized by a raised sine transfer function;
   a light source coupled to the optical modulator;
   a bias control module coupled to the optical modulator, the bias control module being configured to apply an off-quadrature bias to the optical modulator in order to minimize a noise variance that is proportional to $2\sqrt{n\Delta P_{ASE}}$, wherein $n\Delta$ is a signal level n and $P_{ASE}$ is an Amplified Spontaneous Emission Power;
   an EDFA (Erbium Doped Fiber Amplifier) coupled to the optical modulator;
   a filter coupled to the EDFA; and
   an O/E (Optical-to-Electrical) receiver coupled to the filter.

2. The device of claim 1 wherein the bias control module is configured to apply a compression function to the optical modulator to apply the off-quadrature bias.

3. The device of claim 2 wherein the compression function is characterized by an inverse modulator transfer function.

4. The device of claim 2 wherein the bias control module is configured to apply the compression function to cause a signal associated with the optical modulator to exhibit an expanded top eye opening region and a compressed bottom eye opening region.

5. The device of claim 2 wherein the bias control module is configured to apply the off-quadrature bias to the optical modulator to cause a signal having four or more signal levels to exhibit equalized noise contributions associated with the noise variance from each of the signal levels.

6. The device of claim 1 wherein the driver module comprises a differential input, single-ended output, variable gain, linear driver.

7. An optical modulator device, the device comprising:
   a driver module;
   an MZM (Mach Zehnder Modulator) coupled to the driver module, the MZM being characterized by a raised cosine transfer function and being configured for a PAM (Pulse Amplitude Modulation) signal having at least a top eye opening region and a bottom eye opening region;
   a light source coupled to the MZM;
   a bias control module coupled to the MZM, the bias control module being configured to apply a DC compression function to the MZM to bias the MZM off-quadrature in order to minimize a noise variance associated with the PAM signal that is proportional to $2\sqrt{n\Delta P_{ASE}}$, where $n\Delta$ is a signal level n and $P_{ASE}$ is an Amplified Spontaneous Emission Power;
   a first VOA (Variable Optical Attenuator) coupled to the MZM;
   an EDFA (Erbium Doped Fiber Amplifier) coupled to the first VOA;
   a second VOA module coupled to the EDFA;
   a tunable optical filter coupled to the second VOA; and
   an O/E (Optical-to-Electrical) receiver coupled to the tunable optical filter.

8. The device of claim 7 wherein the DC compression function comprises an inverse raised sine function.

9. The device of claim 7 wherein the PAM signal comprises a PAM-4 signal being characterized by four signal levels and three eye opening regions, including a top eye opening region, a middle eye opening region, and a bottom eye opening region.

10. The device of claim 9 wherein the bias control module is configured to apply the DC compression function to the optical modulator such that the bottom eye opening region is compressed and the top eye opening region is expanded.

11. The device of claim 9 wherein the bias control module is configured to apply the DC compression function to the optical modulator such that a noise contribution associated with the noise variance for each of the four levels of the PAM signal are equalized.

12. The device of claim 7 wherein the bias control module is configured to apply the DC compression function to the optical modulator such that the bottom eye opening region is compressed and the top eye opening region is expanded.

13. The device of claim 12 wherein the bias control module is configured to apply the DC compression function to the optical modulator such that a noise contribution for each of the levels of the PAM signal are equalized.

14. The device of claim 12 wherein the bias control module is configured to apply the off-quadrature bias in a downwards direction.

15. The device of claim 7 wherein the driver module comprises a differential input, single-ended output, variable gain, linear driver.

16. An off-quadrature biased optical modulator device, the device comprising:
   a driver module configured for PAM-4 signal modulation characterized by four discrete pulse amplitude levels, including first through fourth amplitude levels, and three eye opening levels, including top, middle, and bottom eye openings; and an MZM (Mach Zehnder Modulator) coupled to the driver module, wherein the MZM is coupled to a laser module and a bias control module, the bias control module being configured to apply a DC compression function to the MZM to bias the MZM off-quadrature in order to minimize a noise variance associated with the PAM signal that is proportional to $2\sqrt{n\Delta P_{ASE}}$, where $n\Delta$ is a signal level n and $P_{ASE}$ is an Amplified Spontaneous Emission Power.

17. The device of claim 16 wherein the bias control module is configured to apply the DC compression function to the MZM such that the bottom eye opening is compressed and the top eye opening is expanded.

18. The device of claim 16 wherein the bias control module is configured to apply the DC compression function to the MZM such that a noise contribution associated with the noise variance for each of the four discrete pulse amplitude levels of the PAM signal are equalized.

19. The device of claim 16 further comprising an EDFA (Erbium Doped Fiber Amplifier) coupled to the signal relay module, the EDFA being coupled to a first VOA (Variable Optical Attenuator) and a second VOA, wherein the EDFA is coupled to a tunable optical filter, which is coupled to an O/E (Optical-to-Electrical) receiver.

20. The device of claim 16 wherein the driver module comprises a differential input, single-ended output, variable gain, linear driver.

* * * * *